United States Patent
Kim et al.

(10) Patent No.: US 11,974,503 B2
(45) Date of Patent: Apr. 30, 2024

(54) THERMOELECTRIC MODULE

(71) Applicant: LG INNOTEK CO., LTD., Seoul (KR)

(72) Inventors: Jong Hyun Kim, Seoul (KR); Young Sam Yoo, Seoul (KR); Se Woon Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 17/640,019

(22) PCT Filed: Sep. 3, 2020

(86) PCT No.: PCT/KR2020/011826
§ 371 (c)(1),
(2) Date: Mar. 3, 2022

(87) PCT Pub. No.: WO2021/045516
PCT Pub. Date: Mar. 11, 2021

(65) Prior Publication Data
US 2022/0320409 A1 Oct. 6, 2022

(30) Foreign Application Priority Data

Sep. 4, 2019 (KR) ............... 10-2019-0109662
Sep. 4, 2019 (KR) ............... 10-2019-0109663
Sep. 4, 2019 (KR) ............... 10-2019-0109664

(51) Int. Cl.
*H10N 10/17* (2023.01)

(52) U.S. Cl.
CPC ................... *H10N 10/17* (2023.02)

(58) Field of Classification Search
None
See application file for complete search history.

(56) References Cited

U.S. PATENT DOCUMENTS 6,176,304 B1 1/2001 Lee
2005/0279104 A1* 12/2005 Leija ............ H10N 10/13
62/3.2
(Continued)

FOREIGN PATENT DOCUMENTS

CN 105609625 A * 5/2016 ........... H01L 35/00
EP 2426748 3/2012
(Continued)

OTHER PUBLICATIONS

English machine translation of Cao (CN-105609625-A) provided by the EPO website, 2023, All Pages. (Year: 2023).*
(Continued)

*Primary Examiner* — Daniel P Malley, Jr.
(74) *Attorney, Agent, or Firm* — KED & ASSOCIATES, LLP

(57) ABSTRACT

Provided is a thermoelectric module. The thermoelectric module includes a thermoelectric element including a first substrate, a first electrode disposed on the first substrate, a semiconductor structure disposed on the first electrode, a second electrode disposed on the semiconductor structure, and a second substrate disposed on the second electrode, a heat sink disposed on the second substrate, and an adhesive layer configured to bond the second substrate to the heat sink. The heat sink has a shape in which predetermined patterns are regularly repeated and connected. Each pattern includes a first surface disposed opposite to the second substrate, a in second surface which extends upward from one end of the first surface, a third surface which extends from the second surface to face the second substrate, and a fourth surface which extends upward from the other end opposite to the one end of the first surface and is connected to a third surface of an adjacent pattern. A distance between the third surface and the second substrate is greater than a distance between the first surface and the second substrate, (Continued)

and the adhesive layer is disposed between the second substrate and the first surface.

18 Claims, 16 Drawing Sheets

(56) References Cited

U.S. PATENT DOCUMENTS

| | | | |
|---|---|---|---|
| 2008/0006843 A1 | 1/2008 | Dai et al. | |
| 2011/0209856 A1 | 9/2011 | Parish, IV et al. | |
| 2015/0233613 A1 | 8/2015 | Cho | |
| 2015/0330677 A1* | 11/2015 | Shin | F25B 21/02 62/3.3 |
| 2019/0244873 A1* | 8/2019 | Davis | H01L 23/373 |

FOREIGN PATENT DOCUMENTS

| | | |
|---|---|---|
| JP | H08-046248 | 2/1996 |
| JP | 2007-093106 | 4/2007 |
| KR | 10-2012-0025432 | 3/2012 |
| KR | 10-2015-0130169 | 11/2015 |
| KR | 10-2018-0029746 | 3/2018 |
| KR | 10-2019-0038103 | 4/2019 |
| WO | WO 83/03924 | 11/1983 |
| WO | WO 02/21607 | 3/2002 |
| WO | WO 2004/049463 | 6/2004 |
| WO | WO 2013/002423 | 1/2013 |

OTHER PUBLICATIONS

International Search Report dated Nov. 27, 2020 issued in Application No. PCT/KR2020/011826.
European Search Report dated Aug. 10, 2023 issued in Application No. 20860493.4.
Korean Office Action dated Sep. 19, 2023 issued in Application No. 10-2019-0109662.
Korean Office Action dated Sep. 19, 2023 issued in Application No. 10-2019-0109664.
Korean Office Action dated Nov. 20, 2023 issued in Application No. 10-2019-0109663.

* cited by examiner

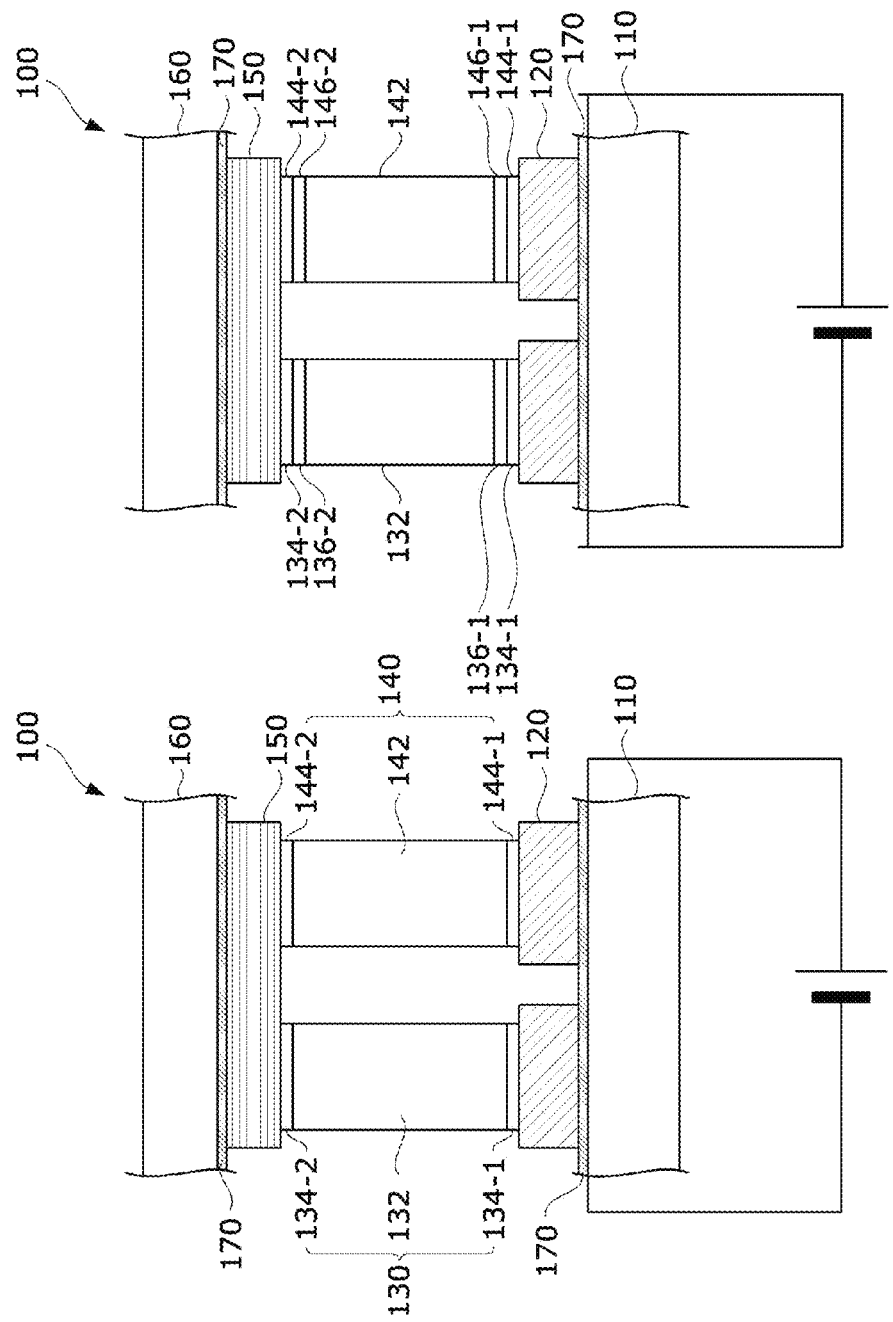
[FIG. 1]

【FIG. 2】
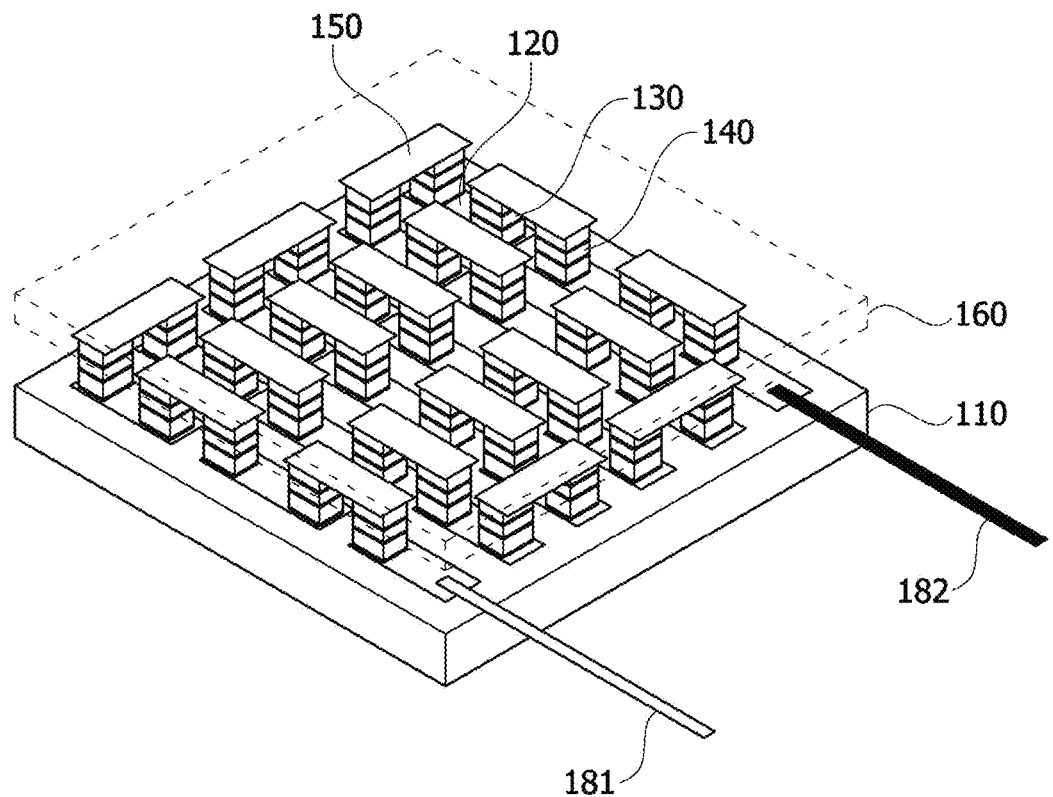
【FIG. 3】
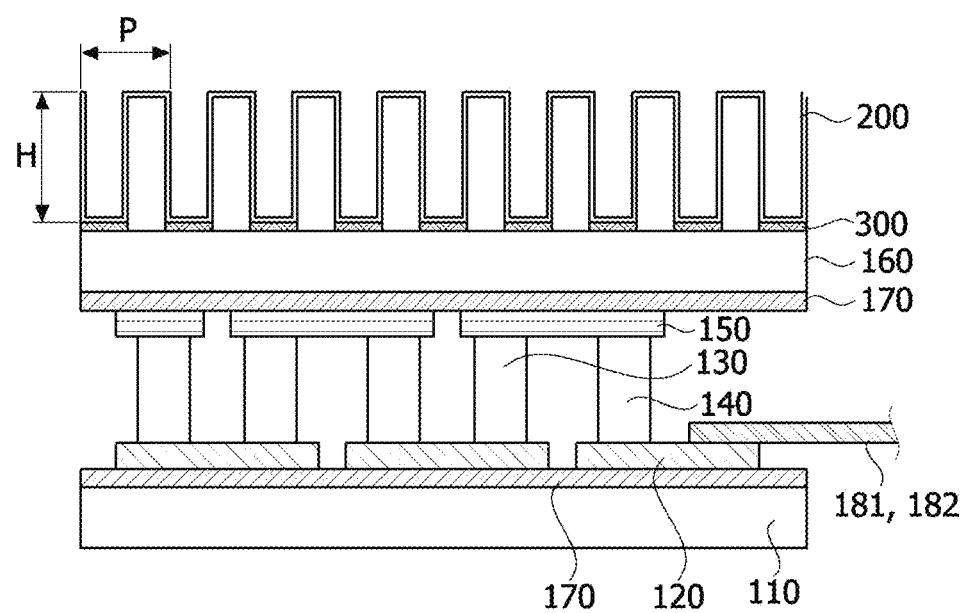

[FIG. 4]
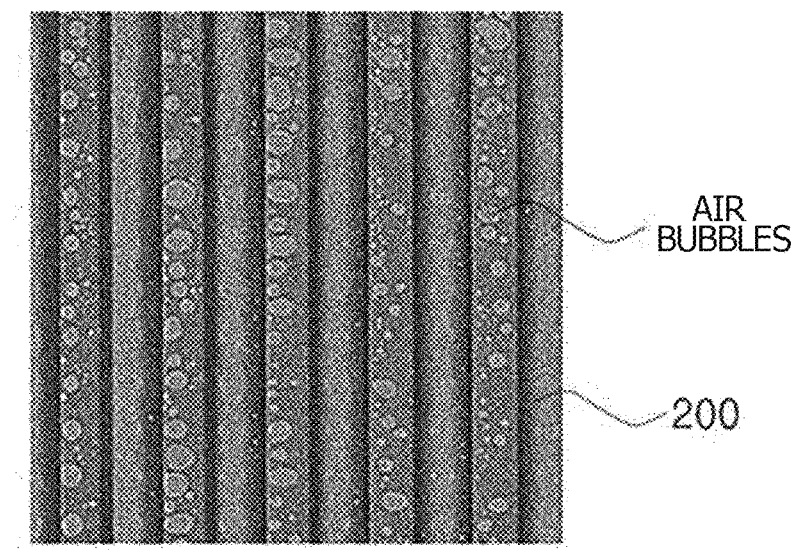
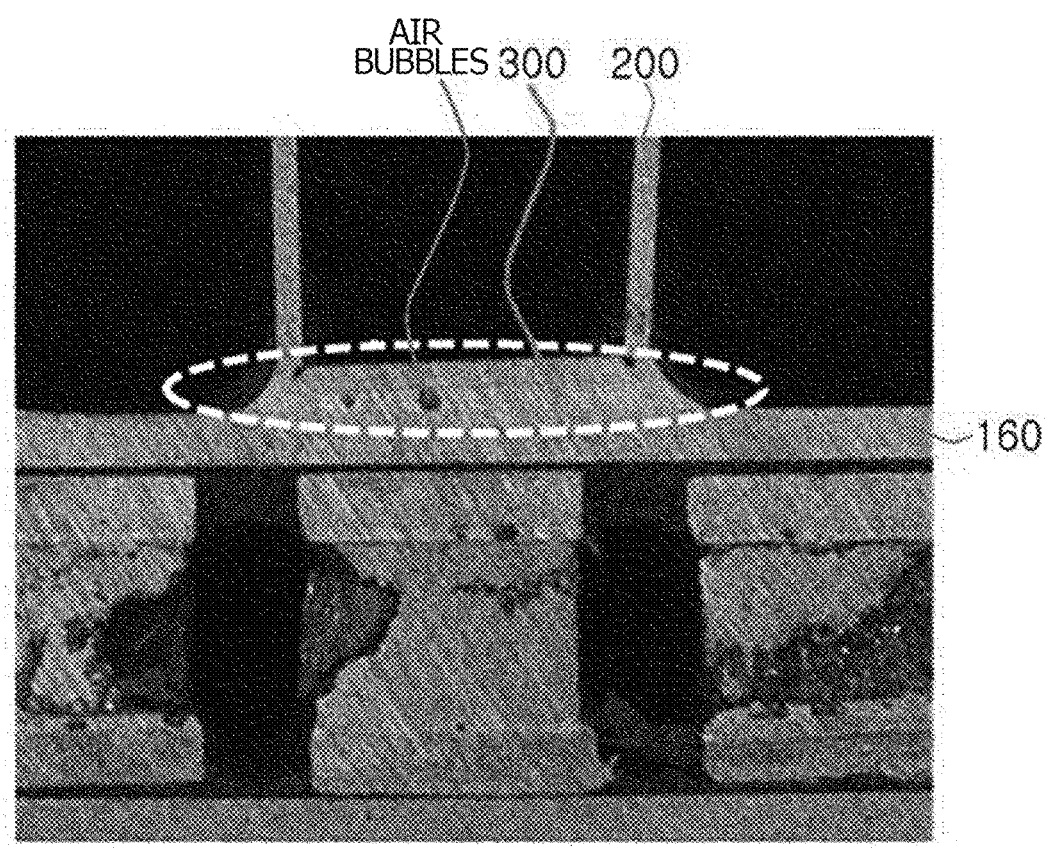

[FIG. 5]
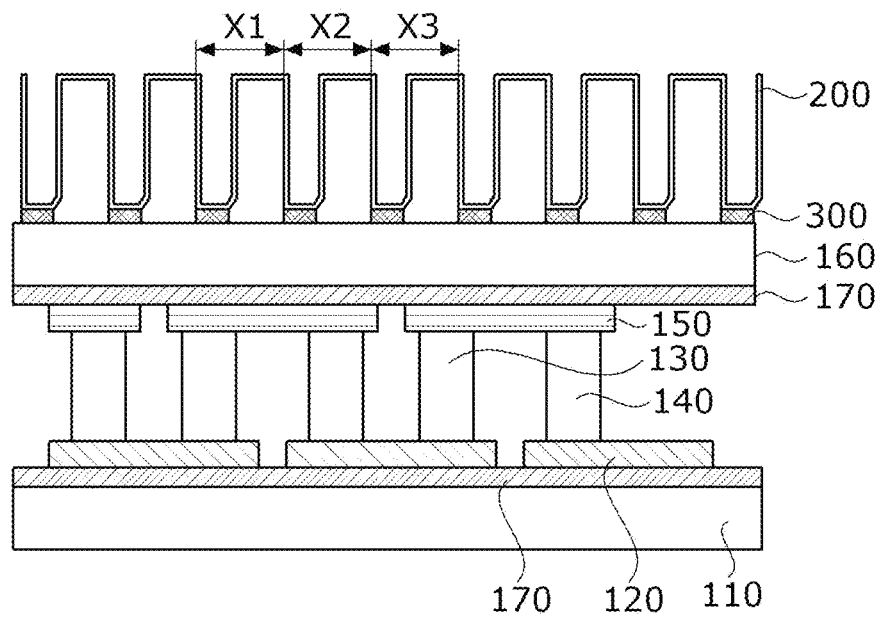
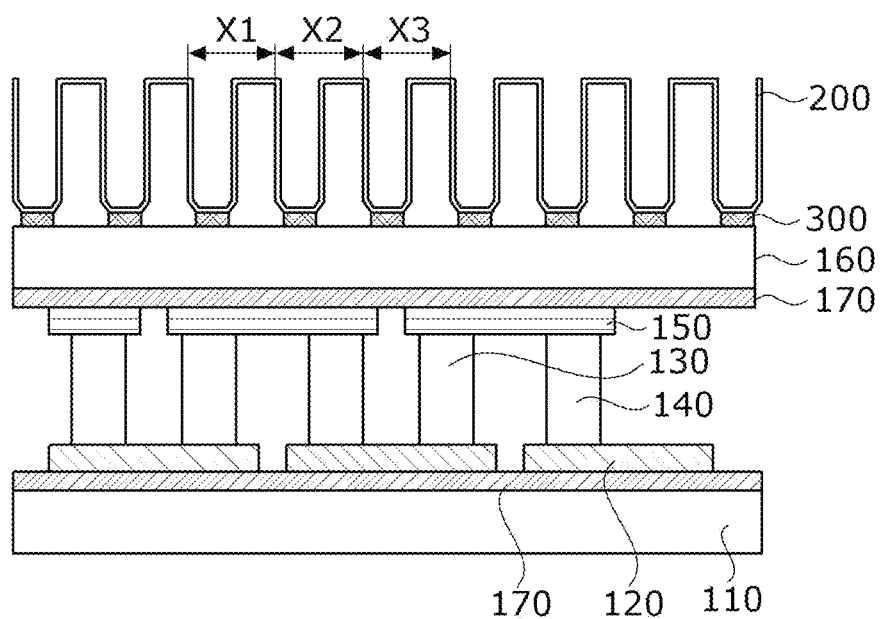

[FIG. 6]
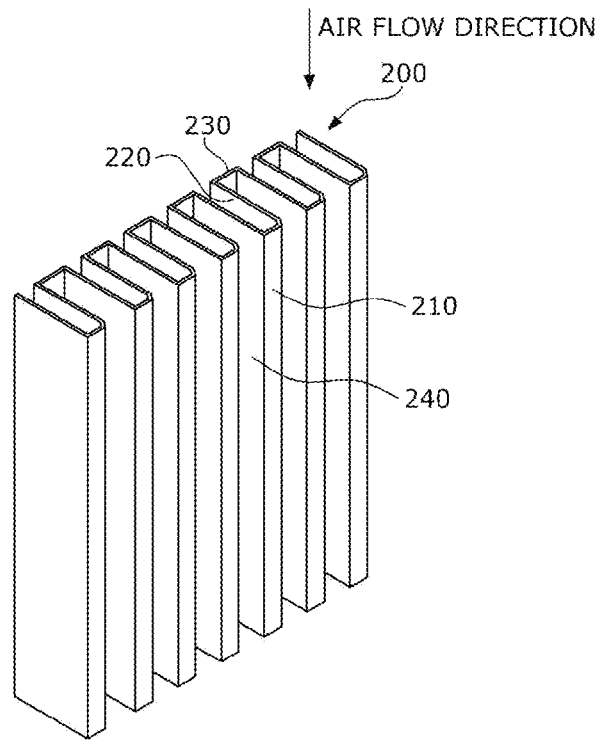
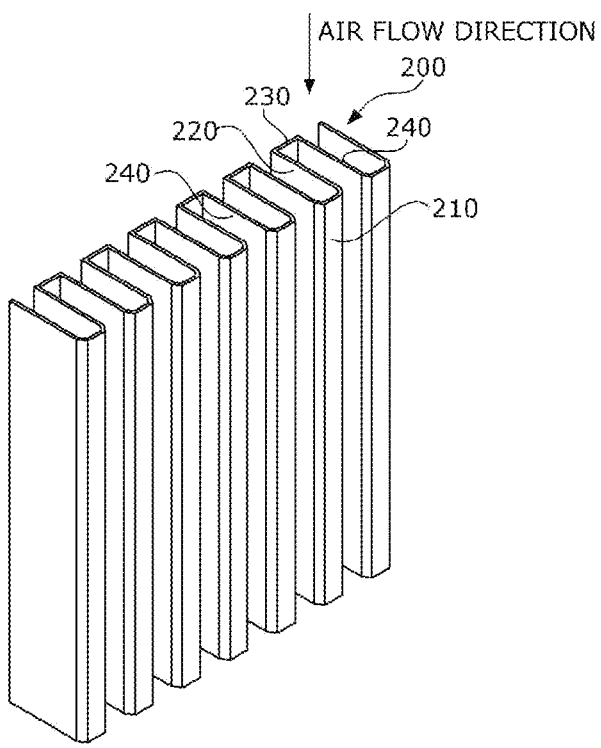

[FIG. 7]
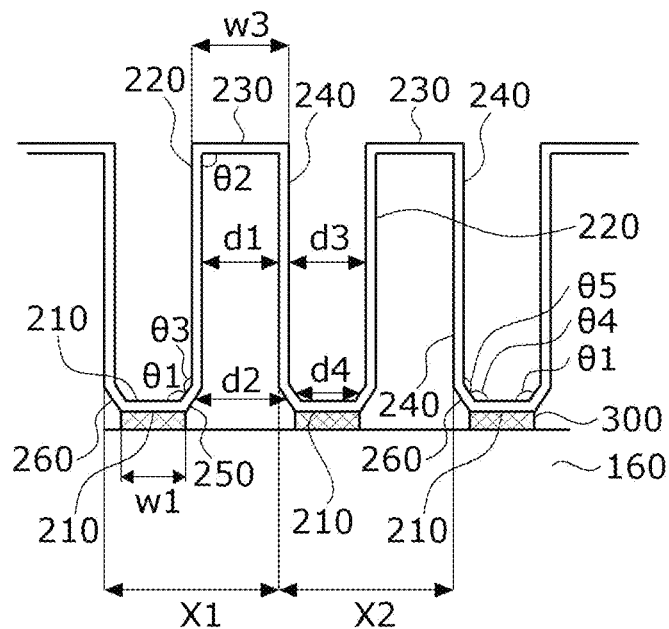
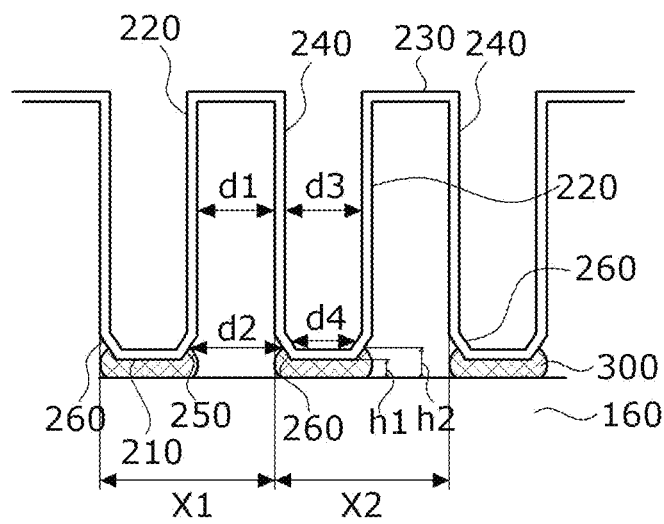

[FIG. 8]
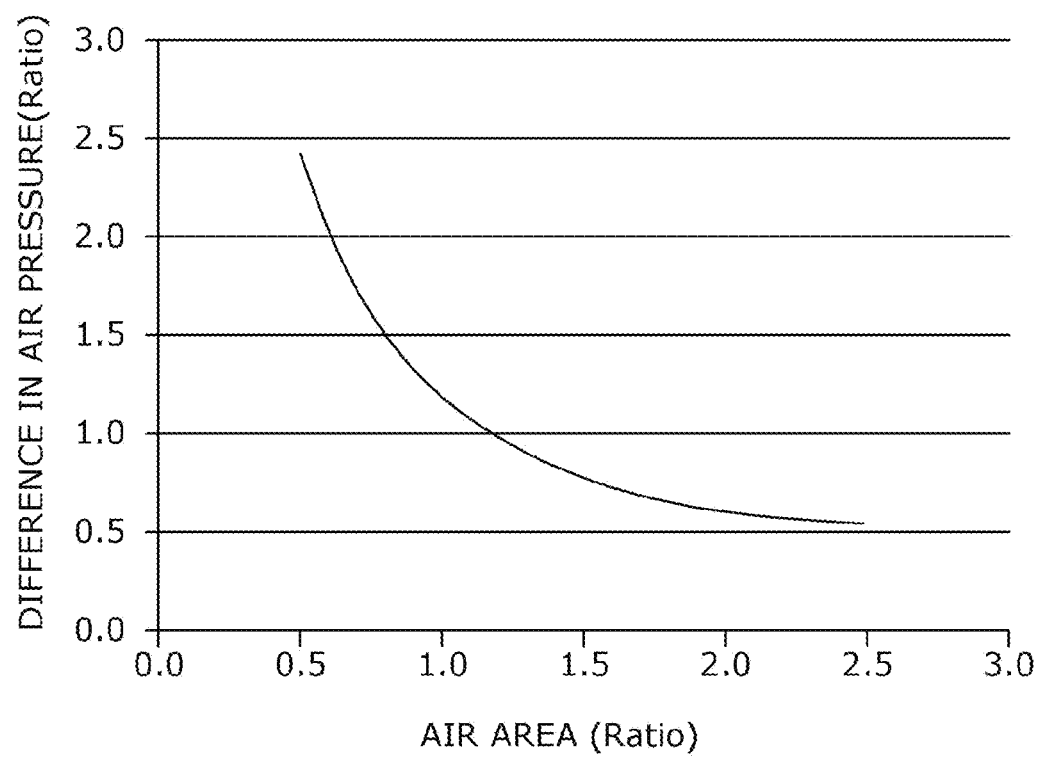

[FIG. 9]
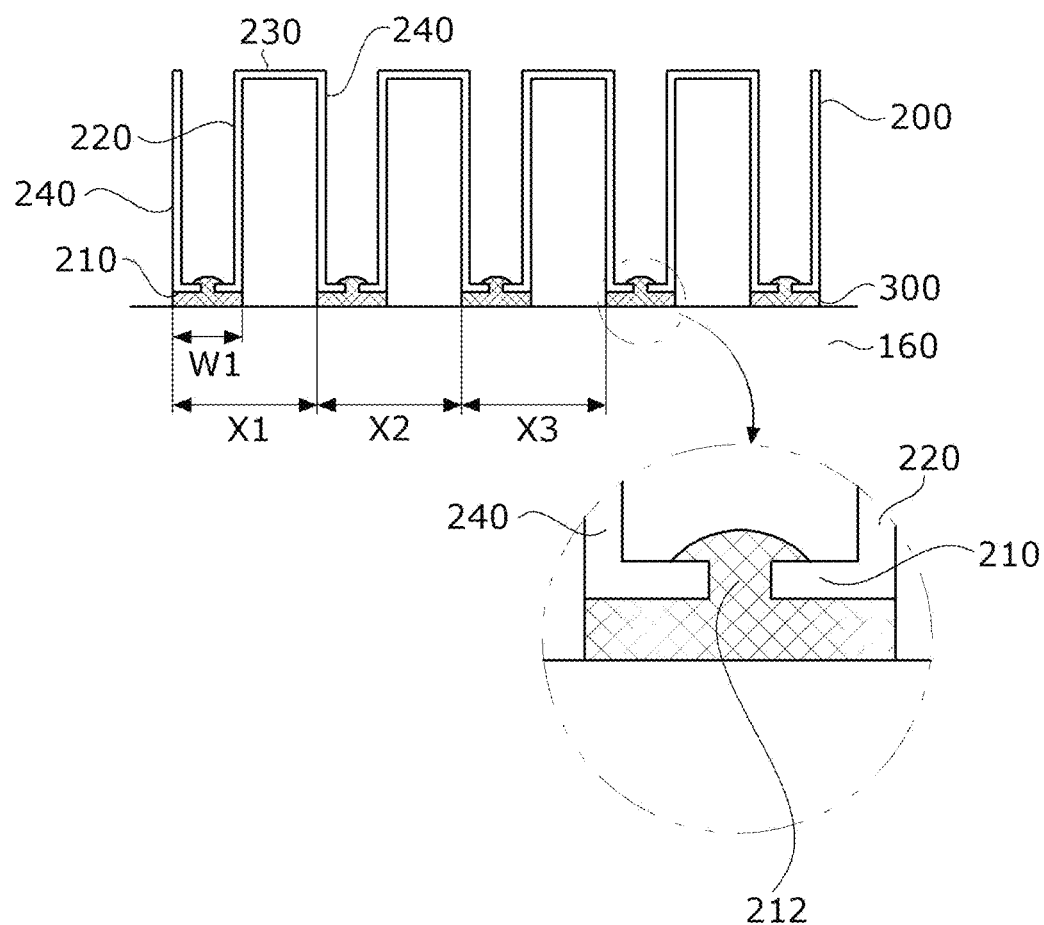

[FIG. 10]
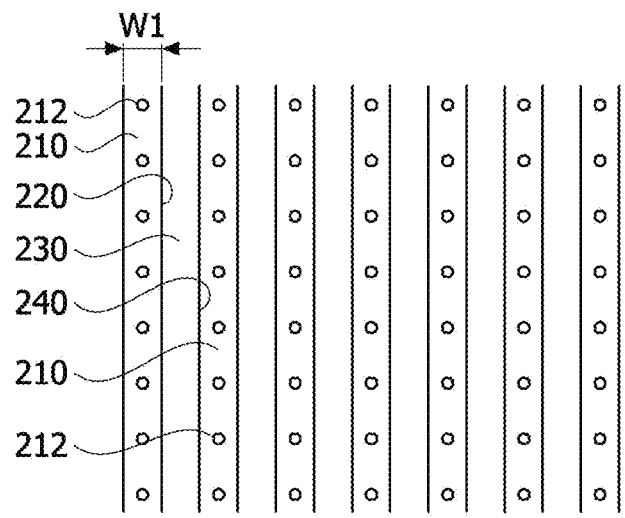
[FIG. 11]
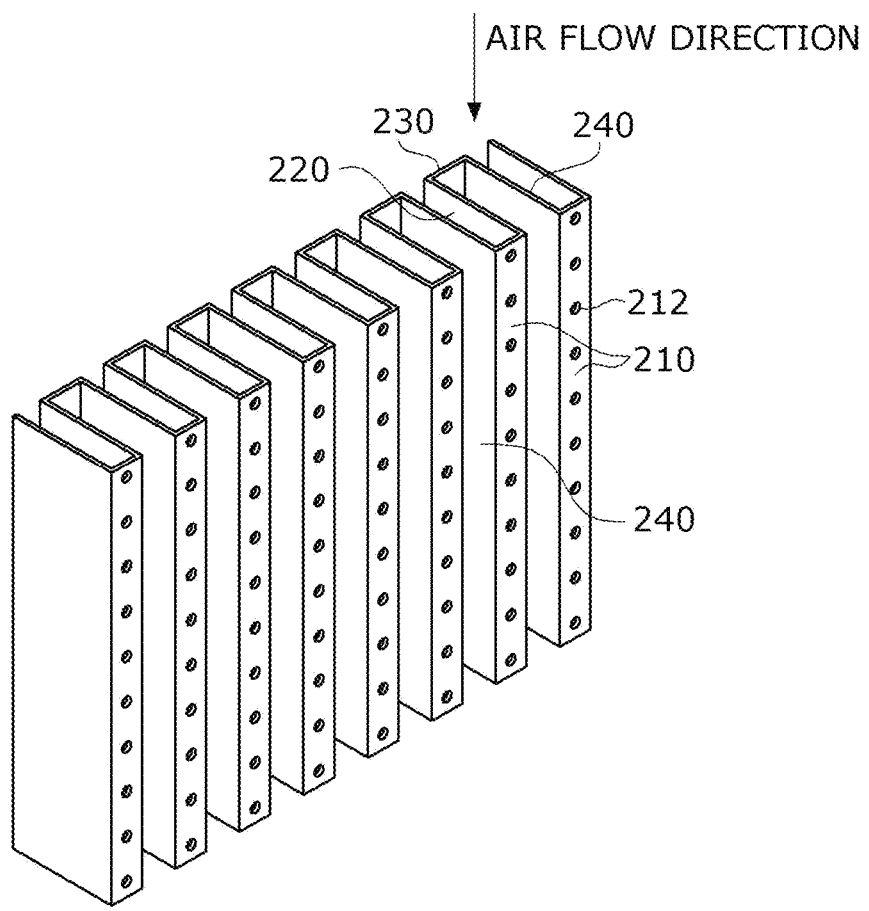

[FIG. 12]
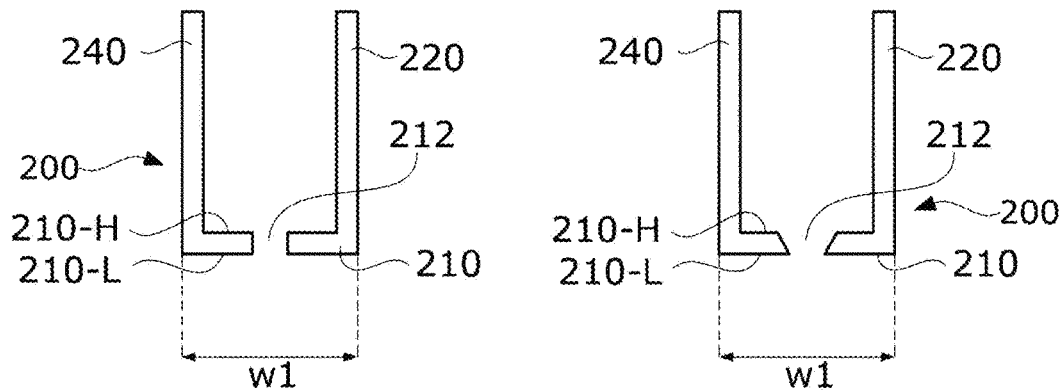
[FIG. 13]
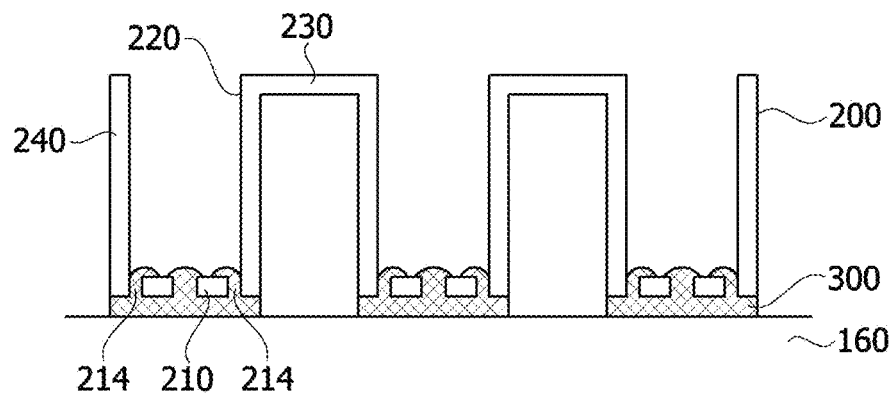
[FIG. 14]
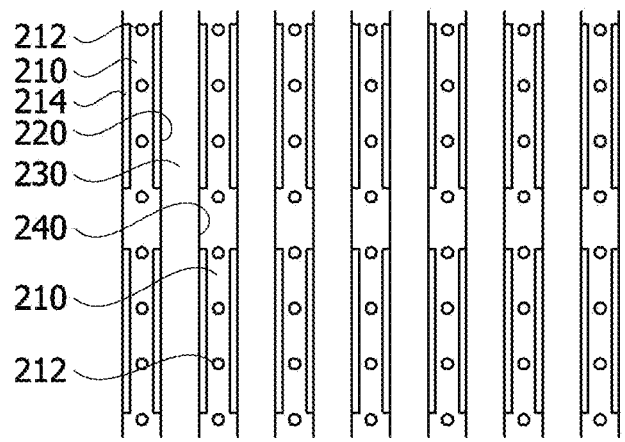

[FIG. 15]
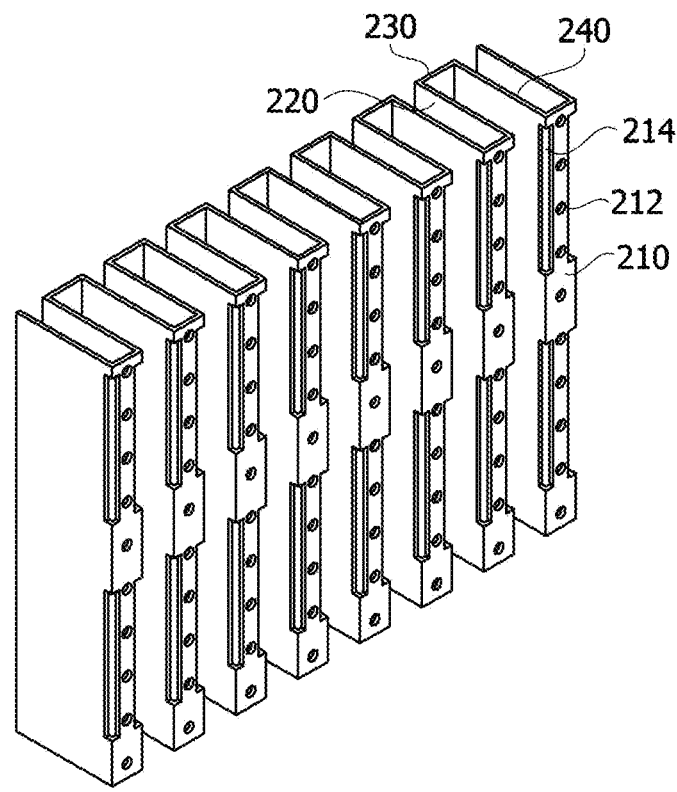
[FIG. 16]
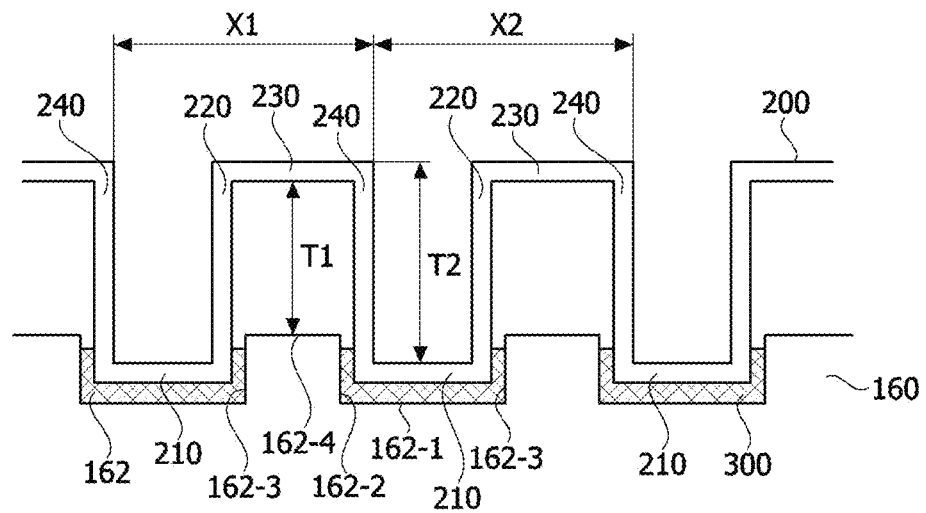

[FIG. 17]
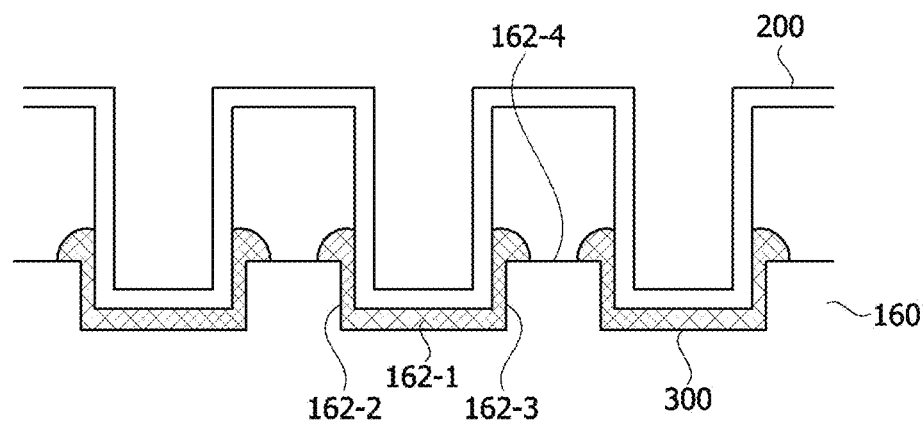
[FIG. 18]
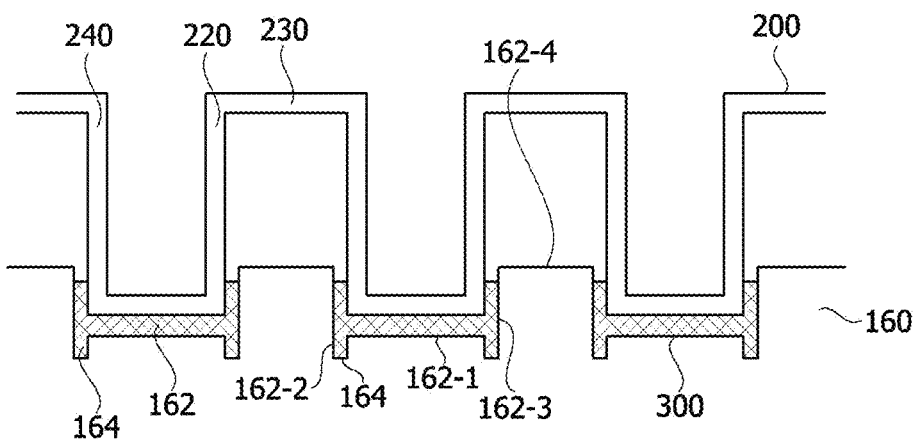

[FIG. 19]
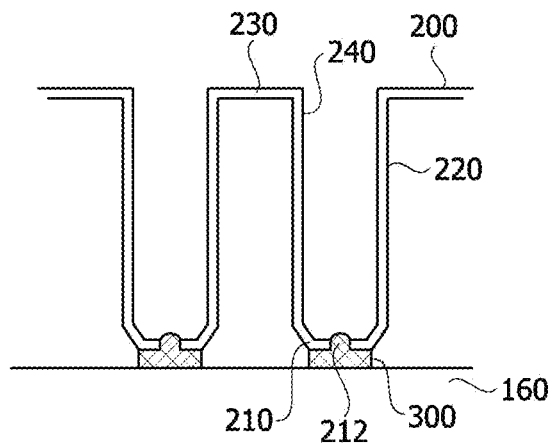
[FIG. 20]
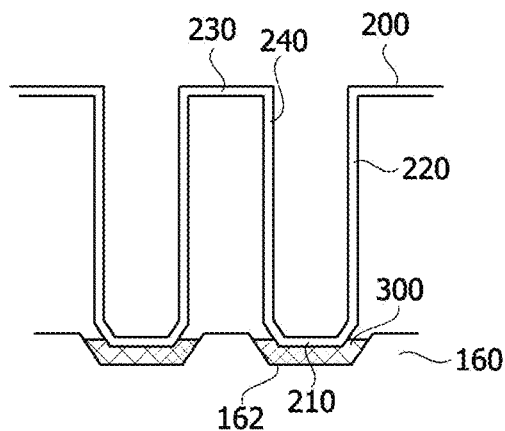

[FIG. 21]
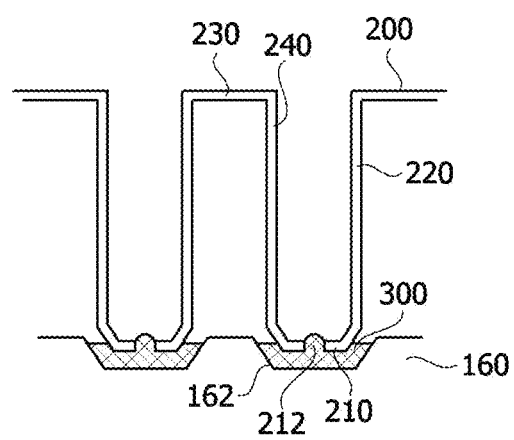
[FIG. 22]
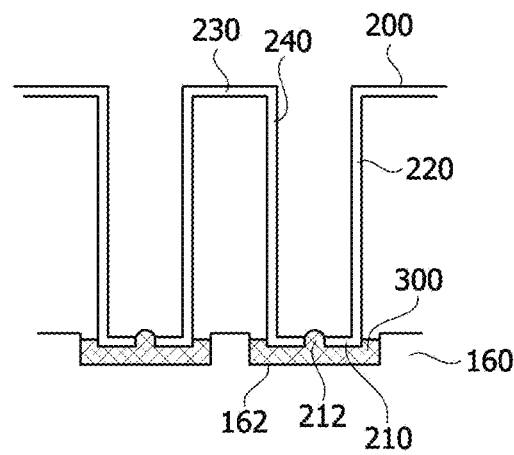

[FIG. 23]
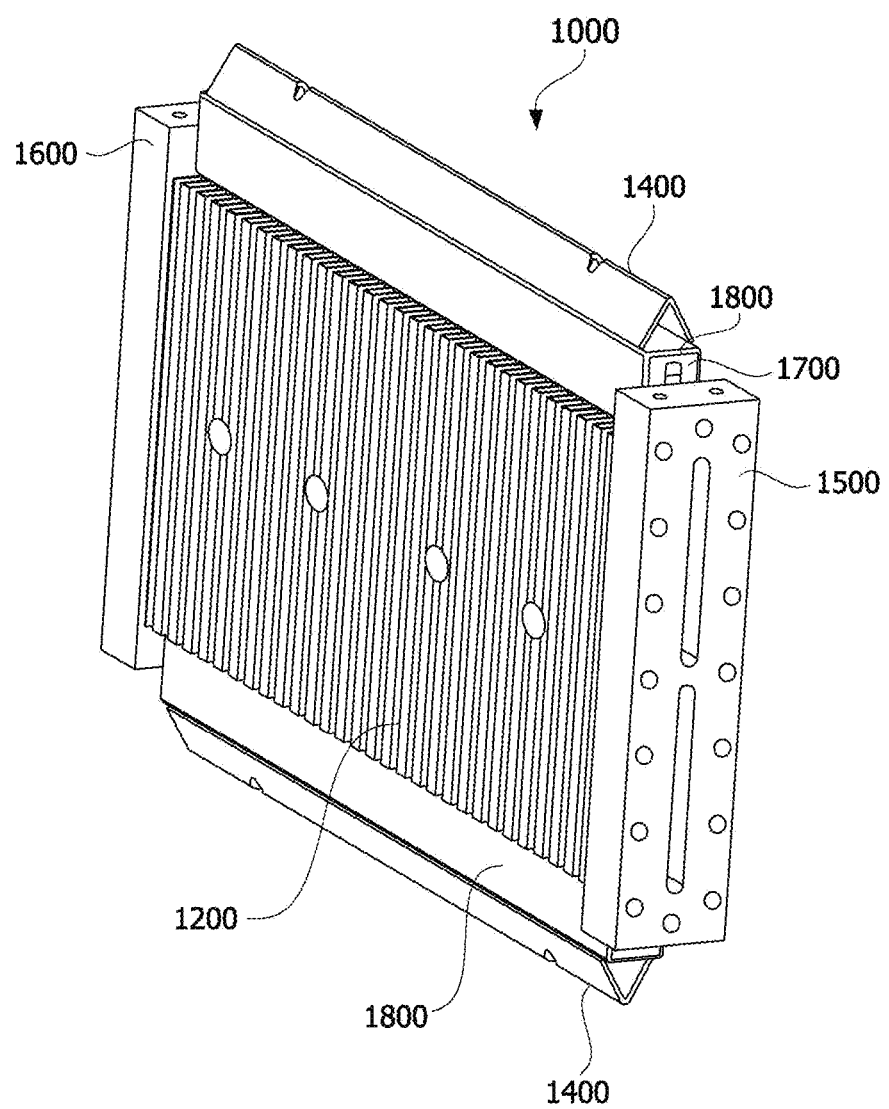

[FIG. 24]
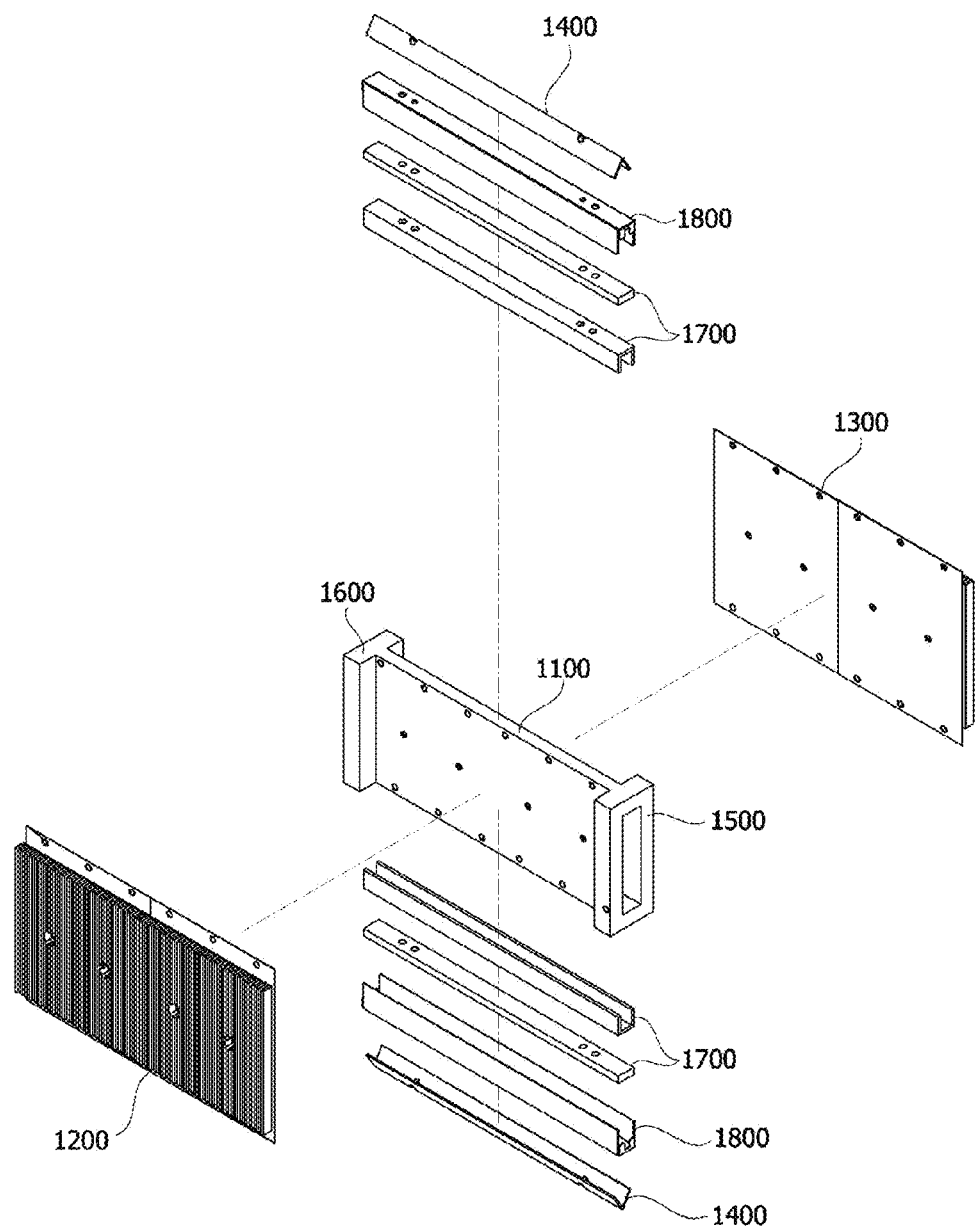

THERMOELECTRIC MODULE

CROSS-REFERENCE TO RELATED PATENT APPLICATIONS

This application is a U.S. National Stage Application under 35 U.S.C. § 371 of PCT Application No. PCT/KR2020/011826, filed Sep. 3, 2020, which claims priority to Korean Patent Application Nos. 10-2019-0109662, 10-2019-0109663 and 10-2019-0109664, filed Sep. 4, 2019, whose entire disclosures are hereby incorporated by reference.

TECHNICAL FIELD

The present invention relates to a thermoelectric module, and more specifically, to a bonding between a substrate of a thermoelectric element and a heat sink.

BACKGROUND ART

The thermoelectric effect is an effect that occurs due to the movement of electrons and holes in a material and refers to direct energy conversion between heat and electricity.

Elements that use the thermoelectric effect are collectively referred to as thermoelectric elements, and the thermoelectric element has a structure in which a P-type thermoelectric material and an N-type thermoelectric material are bonded between metal electrodes to form a PN junction pair.

The thermoelectric elements may be classified into elements that use a change in temperature of electrical resistance, elements that use the Seebeck effect which is a phenomenon in which electromotive force is generated due to a temperature difference, and elements that use the Peltier effect which is a phenomenon in which heat absorption or heat generation caused by current occurs.

The thermoelectric elements are variously applied to home appliances, electronic parts, communication parts, and the like. For example, the thermoelectric elements may be applied to cooling devices, heating devices, power generation devices, and the like. Accordingly, demand for improving thermoelectric performance of the thermoelectric elements is gradually increasing.

A thermoelectric element includes substrates, electrodes, and thermoelectric legs. A plurality of thermoelectric legs are disposed between an upper substrate and a lower substrate, a plurality of upper electrodes are disposed between the plurality of thermoelectric legs and the upper substrate, and a plurality of lower electrodes are disposed between the plurality of thermoelectric legs and the lower substrate.

Meanwhile, a heat sink may be disposed on at least one of two substrates of the thermoelectric element. To this end, there is an attempt to form the substrate and the heat sink as an integral form. However, it becomes difficult to constantly maintain flatness as an area of the substrate increases, and thus, in large-area applications, it is difficult to form a substrate and a heat sink as an integral form in a manufacturing process.

Accordingly, there is an attempt to manufacture a substrate and a heat sink separately and then bond the substrate and the heat sink using a bonding sheet or by soldering.

A bonding force when the substrate and the heat sink are bonded by soldering is greater than when being bonded using the bonding sheet.

However, air bubbles may be present in a solder layer disposed between the substrate and the heat sink, and due to the air bubbles, heat transfer performance and bonding performance between the substrate and the heat sink may be lowered.

Accordingly, a structure for simultaneously improving heat transfer performance and bonding performance between the substrate and the heat sink is required.

DISCLOSURE OF INVENTION

Technical Problem

The present invention is directed to providing a thermoelectric module in which both heat transfer performance and bonding performance between a substrate and a heat sink are improved.

Solution to Problem

According to an aspect of the present invention, there is provided a thermoelectric module which includes a thermoelectric element including a first substrate, a first electrode disposed on the first substrate, a semiconductor structure disposed on the first electrode, a second electrode disposed on the semiconductor structure, and a second substrate disposed on the second electrode, a heat sink disposed on the second substrate, and an adhesive layer configured to bond the second substrate to the heat sink. The heat sink has a shape in which predetermined patterns are regularly repeated and connected. Each pattern includes a first surface disposed to face the second substrate, a second surface which extends upward from one end of the first surface, a third surface which extends from the second surface to face the second substrate, and a fourth surface which extends upward from the other end opposite to the one end of the first surface and is connected to a third surface of an adjacent pattern. A distance between the third surface and the second substrate is greater than a distance between the first surface and the second substrate and the adhesive layer is disposed between the second substrate and the first surface.

A plurality of regularly repeated grooves may be formed in the second substrate, and the adhesive layer and the first surface may be disposed in each groove.

The plurality of grooves may include a first groove and a second groove disposed to be adjacent to each other. One wall surface of the first groove and one wall surface of the second groove may be connected to each other through a connection surface disposed to face the third surface. The adhesive layer may be further disposed on at least a portion of a boundary between the wall surface of each groove and the connection surface.

The adhesive layer may be undisposed on at least a portion of the connection surface corresponding to a middle point of a width of the third surface.

A plurality of holes may be formed in the first surface.

The adhesive layer may protrude upward of the first surface through at least some of the plurality of holes.

At least one slit may be formed along at least one of a boundary between the first surface and the second surface and a boundary between the first surface and the fourth surface, and the adhesive layer may protrude upward of the first surface through the at least one slit.

The third surface may have a width greater than a width of the first surface.

Each pattern may further include a fifth surface disposed between the first surface and the second surface to connect the first surface to the second surface. An internal angle between the first surface and the fifth surface may be greater than an internal angle between the second surface and the third surface.

The adhesive layer may be in direct contact with at least a portion of the fifth surface, and a thickness of the adhesive layer in direct contact with the fifth surface may be greater than a thickness of the adhesive layer in direct contact with the first surface.

According to another aspect of the present invention, there is provided a thermoelectric module including a first substrate, a first insulating layer disposed on the first substrate, a plurality of first electrodes disposed on the first insulating layer, a plurality of thermoelectric legs disposed on the plurality of first electrodes, a plurality of second electrodes disposed on the plurality of thermoelectric legs, a second insulating layer disposed on the plurality of second electrodes, a second substrate disposed on the second insulating layer, an adhesive layer disposed on the second substrate, and a heat sink disposed on the adhesive layer. The heat sink has a shape in which predetermined patterns are regularly repeated and connected. Each pattern includes a first surface which is opposite to the second substrate and is disposed to be in direct contact with the adhesive layer, a second surface which extends upward from one end of the first surface, a third surface which extends from the second surface to face the second substrate, and a fourth surface which extends upward from the other end opposite to the one end of the first surface and is connected to a third surface of an adjacent pattern. A distance between the third surface and the second substrate is greater than a distance between the first surface and the second substrate, regularly repeated predetermined grooves are formed in the second substrate, and the adhesive layer and the first surface are disposed in the groove.

Each groove may include a bottom surface, and two wall surfaces which extend upward from two side surfaces of the bottom surface. The bottom surface, the adhesive layer, and the first surface may be sequentially laminated.

The sum of separation distances between two wall surfaces of each groove and each pattern accommodated in each groove may range from 0.2 to 1 mm.

A first groove and a second groove may be formed in the second substrate, one wall surface of the first groove and one wall surface of the second groove may be connected to each other through a connection surface, and the connection surface may be parallel to the third surface, and the adhesive layer may be further disposed on at least a portion of a boundary between the wall surface of each groove and the connection surface.

The adhesive layer may not be disposed on at least a portion of the connection surface corresponding to a middle point of a width of the third surface.

A distance between the connection surface and the third surface may be 0.8 times or more and less than 1 times a vertical distance between the first surface and the third surface.

At least one notch may be further formed along a boundary between the bottom surface and the two wall surfaces of each groove.

The adhesive layer may be further disposed in the at least one notch.

At least one notch may be further formed on at least one of the two wall surfaces of each groove in a direction perpendicular to the bottom surface, and the adhesive layer may be further disposed in the at least one notch.

According to still another aspect of the present invention, there is provided a thermoelectric module including a first substrate, a first insulating layer disposed on the first substrate, a plurality of first electrodes disposed on the first insulating layer, a plurality of thermoelectric legs disposed on the plurality of first electrodes, a plurality of second electrodes disposed on the plurality of thermoelectric legs, a second insulating layer disposed on the plurality of second electrodes, a second substrate disposed on the second insulating layer, an adhesive layer disposed on the second substrate, and a heat sink disposed on the adhesive layer. The heat sink has a shape in which predetermined patterns are regularly repeated and connected. Each pattern includes a first surface which faces the second substrate and is disposed to be in direct contact with the adhesive layer, a second surface which extends upward from one end of the first surface, a third surface which extends from the second surface to face the second substrate, and a fourth surface which extends upward from the other end opposite to the one end of the first surface and connected to a third surface of an adjacent pattern. A distance between the third surface and the second substrate is greater than a distance between the first surface and the second substrate, and a plurality of holes are disposed in the first surface.

The adhesive layer may protrude through at least some of the plurality of holes and be disposed on the first surface.

An area of the plurality of holes formed in the first surface may range from 10 to 30% of an area of the first surface.

A diameter of at least one of the plurality of holes may range from 25 to 75% of a distance between the fourth surface and the second surface of each pattern.

A diameter of at least one of the plurality of holes at the lowest point of the first surface may be identical to a diameter of the hole at the highest point of the first surface.

A diameter of the at least one of the plurality of holes at the lowest point of the first surface may be different from a diameter of the hole at the highest point of the first surface.

The diameter of the at least one hole at the highest point of the first surface may be greater than the diameter of the at least one hole at the lowest point of the first surface.

The diameter of the at least one hole at the highest point of the first surface may range from 75 to 100% of the distance between the fourth surface and the second surface of each pattern.

At least one slit may be formed along a boundary between the first surface and the second surface.

The adhesive layer may protrude through at least a portion of the at least one slit and be disposed on the first surface and the second surface.

The adhesive layer may not be disposed on at least a portion of the first substrate corresponding to a middle point of a width of the third surface.

According to yet another aspect of the present invention, there is provided a thermoelectric module including a first substrate, a first insulating layer disposed on the first substrate, a plurality of first electrodes disposed on the first insulating layer, a plurality of thermoelectric legs disposed on the plurality of first electrodes, a plurality of second electrodes disposed on the plurality of thermoelectric legs, a second insulating layer disposed on the plurality of second electrodes, a second substrate disposed on the second insulating layer, an adhesive layer disposed on the second substrate, and a heat sink disposed on the adhesive layer. The heat sink has a shape in which predetermined patterns are regularly repeated and connected. Each pattern includes a first surface which faces the second substrate and is disposed to be in direct contact with the adhesive layer, a second surface which extends upward from one end of the first surface, a third surface which extends from the second surface to face the second substrate, and a fourth surface which extends upward from the other end opposite to the one end of the first surface and connected to a third surface of an adjacent pattern. A distance between the third surface and the second substrate is greater than a distance between the first surface and the second substrate, and a width of the third surface is greater than a width of the first surface.

Each pattern may further include at least one of a fifth surface disposed between the first surface and the second surface to connect the first surface to the second surface, and a sixth surface disposed between the first surface and the fourth surface to connect the first surface to the fourth surface. An internal angle between the first surface and the fifth surface may be different from an internal angle between the second surface and the third surface at a boundary between the second surface and the third surface.

The internal angle between the first surface and the fifth surface may be greater than the internal angle between the second surface and the third surface at the boundary between the second surface and the third surface.

An internal angle between the fifth surface and the second surface may be greater than the internal angle between the second surface and the third surface at the boundary between the second surface and the third surface.

The second surface and the fourth surface may be parallel to each other.

Each of the internal angle between the first surface and the fifth surface and the internal angle between the fifth surface and the second surface may be an obtuse angle.

The adhesive layer may be in direct contact with at least a portion of at least one of the fifth surface and the sixth surface.

A maximum height of the adhesive layer in direct contact with the at least the portion of at least one of the fifth surface and the sixth surface may be greater than a maximum height of the adhesive layer in direct contact with the first surface.

The adhesive layer may not be disposed on at least a portion of the second substrate corresponding to a middle point of a width of the third surface.

A distance between the second surface and the fourth surface of each pattern may be greater than a distance between the fifth surface and the sixth surface of each pattern, and a distance between the second surface of each pattern and a fourth surface of an adjacent pattern may be smaller than a distance between the fifth surface of each pattern and a sixth surface of the adjacent pattern.

The width of the first surface of each pattern may range from 0.2 to 0.4 times the distance from the second surface to the fourth surface of each pattern.

A maximum height from the first surface to the fifth surface may range from 1.5 to 3 times a thickness of the adhesive layer disposed below the first surface.

Advantageous Effects of Invention

According to the embodiments of the present invention, thermoelectric modules having excellent performance and high reliability can be obtained. In particular, according to the embodiments of the present invention, thermoelectric modules having improved heat transfer performance between a substrate and a heat sink, improved bonding performance, and high durability can be obtained.

The thermoelectric elements according to the embodiments of the present invention can be applied not only to applications implemented in a small size but also to applications implemented in large sizes such as vehicles, ships, steel mills, incinerators, and the like.

BRIEF DESCRIPTION OF DRAWINGS

The above and other objects, features and advantages of the present invention will become more apparent to those of ordinary skill in the art by describing exemplary embodiments thereof in detail with reference to the accompanying drawings, in which:

FIG. 1 illustrates cross-sectional views of a thermoelectric element;

FIG. 2 is a perspective view of the thermoelectric element;

FIG. 3 is a cross-sectional view of a thermoelectric module including a heat sink;

FIG. 4 illustrates views illustrating an example in which a substrate of a thermoelectric element and a heat sink are bonded;

FIG. 5 illustrates cross-sectional views of a thermoelectric module according to an embodiment of the present invention;

FIG. 6 illustrates perspective views of a heat sink included in the thermoelectric module according to the embodiment of FIG. 5;

FIG. 7 illustrates enlarged partial cross-sectional views of the thermoelectric module according to the embodiment of FIG. 5;

FIG. 8 is a graph showing a differential pressure ratio with respect to an area of an air flow path of a heat sink;

FIG. 9 is a partial cross-sectional view of a thermoelectric module according to another embodiment of the present invention;

FIG. 10 is a top view of a heat sink included in the thermoelectric module according to the embodiment of FIG. 9;

FIG. 11 is a perspective view of the heat sink included in the thermoelectric module according to the embodiment of FIG. 9;

FIG. 12 illustrates specific examples of a portion of the heat sink included in the thermoelectric module according to the embodiment of FIG. 9;

FIG. 13 is a partial cross-sectional view of a thermoelectric module according to still another embodiment of the present invention;

FIG. 14 is a top view of a heat sink included in the thermoelectric module according to the embodiment of FIG. 13;

FIG. 15 is a perspective view of the heat sink included in the thermoelectric module according to the embodiment of FIG. 13;

FIGS. 16 to 18 are partial cross-sectional views of a thermoelectric module according to yet another embodiment of the present invention;

FIGS. 19 to 22 are partial cross-sectional views of a thermoelectric module according to yet another embodiment of the present invention;

FIG. 23 is a perspective view illustrating an example of a heat conversion device to which the thermoelectric modules according to the embodiments of the present invention are applied; and FIG. 24 is an exploded perspective view of the heat conversion device of FIG. 23.

MODE FOR THE INVENTION

Hereinafter, exemplary embodiments of the present invention will be described in detail with reference to the accompanying drawings.

However, it should be understood that the technical spirit of the present invention is not limited to embodiments to be disclosed below but may be implemented in many different forms. It should be understood that, within the scope of the present invention, one or more elements of each of the embodiments may be selectively combined and substituted.

In addition, the terms (including technical and scientific terms) used in the embodiments of the present invention have the same meaning as commonly understood by one of ordinary skill in the art to which the present invention belongs. It should be further understood that terms, such as those defined in commonly used dictionaries, should be interpreted as having a meaning that is consistent with their meaning in the context of the related art.

Further, the terms used in the embodiments of the present invention are provided only to describe the embodiments of the present invention and not for purposes of limitation.

In this specification, the singular forms include the plural forms unless the context clearly indicates otherwise, and the phrase "at least one element (or one or more elements) of an element A, an element B, and an element C," should be understood as including the meaning of one or more of all combinations being obtained by combining the element A, the element B, and the element C.

Further, in describing elements of the present invention, terminologies such as first, second, A, B, (a), and (b) may be used.

The term is used to distinguish an element from another element but a nature, an order, or a sequence of the elements is not limited by the terminology.

It will be understood that when an element is referred to as being "connected" or "coupled" to another element, it can be directly connected or coupled to another element, intervening elements may be present, or it can be connected or coupled to another element through the other element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, the term "on (above)" or "under (below)" includes a case in which another element is disposed in an upward direction or a downward direction with respect to one element.

FIG. 1 illustrates cross-sectional views of a thermoelectric element, and FIG. 2 is a perspective view of the thermoelectric element. FIG. 3 is a cross-sectional view of a thermoelectric module including a heat sink, and FIG. 4 illustrates views illustrating an example in which a substrate of a thermoelectric element and a heat sink are bonded.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and upper bottom surfaces of the P-type thermoelectric legs 130 and the N-type thermoelectric legs 140. Accordingly, the plurality of P-type thermoelectric legs 130 and the plurality of N-type thermoelectric legs 140 are electrically connected by the lower electrodes 120 and the upper electrodes 150. A pair of P-type thermoelectric leg 130 and N-type thermoelectric leg 140, which are disposed between the lower electrode 120 and the upper electrode 150 and electrically connected to each other, may form a unit cell.

For example, when a voltage is applied to the lower electrode 120 and the upper electrode 150 through lead wires 181 and 182, the substrate through which a current flows from the P-type thermoelectric leg 130 to the N-type thermoelectric leg 140 due to the Peltier effect may absorb heat to act as a cooling unit, and the substrate through which a current flows from the N-type thermoelectric leg 140 to the P-type thermoelectric leg 130 may be heated to act as a heat generating unit. Alternatively, when a difference between temperatures of the lower electrode 120 and the upper electrode 150 occurs, charges in the P-type thermoelectric leg 130 and the N-type thermoelectric leg 140 may be moved due to the Seebeck effect and electricity may be generated.

Here, the P-type thermoelectric leg 130 and the N-type thermoelectric leg 140 may be bismuth telluride (Bi—Te) based thermoelectric legs containing bismuth (Bi) and tellurium (Te) as main raw materials. The P-type thermoelectric leg 130 may be a bismuth telluride (Bi—Te) based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include 99 to 99.999 wt % Bi—Sb—Te, which is a main raw material, based on a total weight of 100 wt %, and at least one of nickel (Ni), aluminum (Al), copper (Cu), silver (Ag), lead (Pb), boron (B), gallium (Ga), and indium (In) is included at 0.001 to 1 wt %. The N-type thermoelectric leg 140 may be a bismuth telluride (Bi—Te) based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include 99 to 99.999 wt % Bi—Se—Te, which is a main raw material, based on a total weight of 100 wt %, and at least one of nickel (Ni), aluminum (Al), copper (Cu), silver (Ag), lead (Pb), boron (B), gallium (Ga), and indium (In) is included at 0.001 to 1 wt %.

The P-type thermoelectric leg 130 and the N-type thermoelectric leg 140 may be formed as a bulk type or a laminated type. Generally, a bulk-type P-type thermoelectric leg 130 or a bulk-type N-type thermoelectric leg 140 may be obtained through a process in which a thermoelectric material is heat-treated to form an ingot, the ingot is pulverized and sieved to obtain powder for a thermoelectric leg, the powder is then sintered, and the sintered powder is cut. In this case, the P-type thermoelectric leg 130 and the N-type thermoelectric leg 140 may be polycrystalline thermoelectric legs. In order to obtain the polycrystalline thermoelectric legs, when powder for a thermoelectric leg is sintered, the powder for a thermoelectric leg may be compressed at 100 MPa to 200 MPa. For example, when the P-type thermoelectric leg 130 is sintered, the powder for a thermoelectric leg may be sintered at 100 to 150 MPa, preferably, 110 to 140 MPa, and more preferably, 120 to 130 MPa. In addition, when the N-type thermoelectric leg 140 is sintered, the powder for a thermoelectric leg may be sintered at 150 to 200 MPa, preferably, 160 to 195 MPa, and more preferably, 170 to 190 MPa. As described above, when the P-type thermoelectric leg 130 and the N-type thermoelectric leg 140 are polycrystalline thermoelectric legs, the strength of the P-type thermoelectric leg 130 and the N-type thermoelectric leg 140 may be increased. A laminated-type P-type thermoelectric leg 130 or a laminated-type N-type thermoelectric leg 140 may be obtained through a process in which a unit member is formed by applying a paste including a thermoelectric material on a sheet-shaped base and then the unit member is laminated and cut.

In this case, the pair of P-type thermoelectric leg 130 and N-type thermoelectric leg 140 may have the same shape and volume or may have different shapes and volumes. For example, the electric conduction characteristics of the P-type thermoelectric leg 130 and the N-type thermoelectric leg 140 are different, and thus the N-type thermoelectric leg 140 may be formed to have a height or cross-sectional area different from that of the P-type thermoelectric leg 130.

In this case, the P-type thermoelectric leg 130 or the N-type thermoelectric leg 140 may have a cylindrical shape, a polygonal column shape, an elliptical column shape, or the like.

Alternatively, the P-type thermoelectric leg 130 or the N-type thermoelectric leg 140 may have a laminated structure. For example, the P-type thermoelectric leg or the N-type thermoelectric leg may be formed by a method in which a plurality of structures coated with a semiconductor material are laminated on a sheet-shaped base and then cut. Accordingly, it is possible to prevent loss of the materials and improve electrical conduction characteristics. Each structure may further include a conductive layer having an opening pattern, and accordingly, an adhesive force between the structures may be increased, thermal conductivity may be lowered, and electrical conductivity may be increased.

Alternatively, the P-type thermoelectric leg 130 or the N-type thermoelectric leg 140 may be formed to have different cross-sectional areas in one thermoelectric leg. For example, cross-sectional areas of both ends disposed to face the electrode in one thermoelectric leg may be greater than a cross-sectional area of a gap between the both ends. Accordingly, the both ends may be formed to have a large temperature difference therebetween, and thus thermoelectric efficiency may be increased.

The performance of the thermoelectric element according to the embodiment of the present invention may be expressed as a thermoelectric figure of merit (ZT). The thermoelectric figure of merit (ZT) may be expressed as in Equation 1.

$$ZT = \alpha^2 \cdot \sigma \cdot T/k \quad \text{[Equation 1]}$$

Here, α denotes the Seebeck coefficient [V/K], σ denotes the electrical conductivity [S/m], and $\alpha^2\sigma$ denotes a power factor [W/mK$^2$]. In addition, T denotes the temperature and k denotes the thermal conductivity [W/mK]. k may be expressed as a·cp·ρ, and a denotes the thermal diffusivity [cm$^2$/S], cp denotes the specific heat [J/gK], and ρ denotes the density [g/cm$^3$].

In order to obtain the thermoelectric figure of merit of the thermoelectric element, a Z value (V/K) may be measured using a Z meter, and the thermoelectric figure of merit (ZT) may be calculated using the measured Z value.

Here, the lower electrodes 120, which are disposed between the lower substrate 110 and the P-type thermoelectric leg 130 and the N-type thermoelectric leg 140, and the upper electrodes 150, which are disposed between the upper substrate 160 and the P-type thermoelectric leg 130 and the N-type thermoelectric leg 140, may include at least one of copper (Cu), silver (Ag), aluminum (Al), and nickel (Ni), and have a thickness of 0.01 mm to 0.3 mm. When the thickness of the lower electrode 120 or the upper electrode 150 is less than 0.01 mm, a function as an electrode of the lower electrode 120 or the upper electrode 150 may be lowered and thus electric conduction performance may be lowered, and when the thickness of the lower electrode 120 or the upper electrode 150 is greater than 0.3 mm, the conduction efficiency may be lowered due to an increase in resistance.

In addition, the lower substrate 110 and the upper substrate 160 opposite to each other may be metal substrates, and a thickness of the metal substrate may range from 0.1 mm to 1.5 mm. When the thickness of the metal substrate is less than 0.1 mm or greater than 1.5 mm, heat radiation characteristics or thermal conductivity may be excessively high, and thus reliability of the thermoelectric element may be lowered. However, the thickness of the metal substrate described herein is exemplary and may be changed according to the size of the thermoelectric element 100 and an application applied thereto. The metal substrate may be, for example, an aluminum, aluminum alloy, copper, copper alloy, or aluminum-copper alloy substrate, but the present invention is not limited thereto, and the metal substrate may be a substrate made of a metal having high thermal conduction performance. Further, when the lower substrate 110 and the upper substrate 160 are metal substrates, an insulating layer 170 may be further formed between the lower substrate 110 and the lower electrode 120 and further formed between the upper substrate 160 and the upper electrode 150. The insulating layer 170 may include a material having a thermal conductivity of 1 to 20 W/mK.

In this case, the insulating layer 170 may include a resin composition and an inorganic filler. The resin composition may be made of a resin layer including at least one of an epoxy resin composition and a silicone resin composition, and the inorganic filler may include at least one of an oxide and a nitride. Accordingly, due to the insulating layer 170, an insulating characteristic, a bonding force, and thermal conduction performance may be improved. Here, the insulating characteristic may refer to a withstand voltage characteristic in which insulation between adjacent layers is prevented and dielectric breakdown under high voltage is prevented.

Here, the inorganic filler may be included at 68 to 88 vol % of the resin layer. When the inorganic filler is included at less than 68 vol %, the thermal conduction effect may be lowered, and when the inorganic filler is included at greater than 88 vol %, the resin layer may be easily broken.

In addition, when the resin composition includes an epoxy resin, the epoxy resin may include an epoxy compound and a curing agent. In this case, the curing agent may be included in a volume ratio of 1 to 10 with respect to 10 volume ratio of the epoxy compound. Here, the epoxy compound may include at least one of a crystalline epoxy compound, an amorphous epoxy compound, and a silicone epoxy compound. When the resin composition includes a silicone resin, the silicone resin may include polydimethylsiloxane (PDMS).

The inorganic filler may include at least one of an oxide and a nitride having heat radiation characteristics or insulating characteristics, and the nitride may be included at 95 wt % of the inorganic filler, and more preferably, 60 to 80 wt %. When the nitride is included in the above numerical range, conductivity and bonding strength may be increased. Here, the nitride may include at least one of boron nitride and aluminum nitride, and the oxide may include at least one of aluminum oxide, titanium oxide, and zinc oxide.

When the nitride includes boron nitride, the boron nitride may be applied in the form of an aggregate. In this case, a particle size D50 of the boron nitride aggregate may range from 250 to 350 μm, and a particle size D50 of aluminum oxide may range from 10 to 30 μm. When the particle size D50 of the boron nitride aggregate and the particle size D50 of the aluminum oxide satisfy in the above numerical ranges, the boron nitride aggregate and the aluminum oxide may be evenly dispersed in the resin layer. Accordingly, it is possible to have an even thermal conduction effect and adhesion performance throughout the resin layer.

Although not illustrated, at least one of the insulating layers 170 which are disposed between the lower substrate 110 and the lower electrode 120 and between the upper substrate 160 and the upper electrode 150 may be formed as a plurality of layers. In this case, the plurality of layers may include the same resin composition or inorganic filler or different resin compositions or inorganic fillers, and the respective layers may have different thicknesses. Accordingly, due to the insulating layer 170, at least one of an insulating characteristic, a bonding force, and thermal conduction performance may be further improved.

Alternatively, the lower substrate 110 and the upper substrate 160 opposite to each other may be insulating substrates. The insulating substrate may be a ceramic substrate having thermal conductivity performance and insulation performance or a substrate made of a polymer resin. The ceramic substrate may be, for example, an aluminum oxide substrate, an aluminum nitride substrate, or the like.

Alternatively, one of the lower substrate 110 and the upper substrate 160 opposite to each other may be a metal substrate, and the other may be an insulating substrate.

The lower substrate 110 and the upper substrate 160 may be formed to be different sizes. Preferably, the lower substrate 110 may be formed to have a volume, a thickness, or an area greater than that of the upper substrate 160 and thus may be selectively disposed in a high-temperature region or a low-temperature region. For example, when it is necessary to optimize heat transfer efficiency through relative improvement of heat radiation performance, the lower substrate 110 may be disposed in the high-temperature region. Conversely, when it is necessary to optimize heat transfer efficiency through relative improvement of heat absorption performance, the lower substrate 110 may be disposed in the low-temperature region. As another example, in the case in which a sealing member for protecting the thermoelectric module from an external environment is disposed on the lower substrate 110, when an additional bonding or fastening region is formed in the lower substrate 110 for coupling to the low-temperature region or the high-temperature region, the lower substrate 110 may be formed to have at least one of a volume, a thickness, or an area greater than that of the upper substrate 160. In this case, the lower substrate 110 may be formed to have an area ranging from 1.2 to 5 times an area of the upper substrate 160. When the lower substrate 110 is formed to have an area less than 1.2 times the area of the upper substrate 160, an effect on improving heat transfer efficiency is not high, and when the lower substrate 110 is formed to have an area greater than 5 times the area of the upper substrate 160, the heat transfer efficiency may rather be significantly degraded and it may be difficult to maintain a basic shape of the thermoelectric module.

In addition, a heat radiation pattern, for example, an uneven pattern, may be formed on a surface of at least one of the lower substrate 110 and the upper substrate 160. Accordingly, the heat radiation performance of the thermoelectric element may be increased. When the uneven pattern is formed on a surface in contact with the P-type thermoelectric leg 130 or the N-type thermoelectric leg 140, bonding characteristics between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

Although not illustrated, a sealing member may be further disposed between the lower substrate 110 and the upper substrate 160. The sealing member may be disposed between the lower substrate 110 and the upper substrate 160 to be disposed on side surfaces of the lower electrode 120, the P-type thermoelectric leg 130, the N-type thermoelectric leg 140, and the upper electrode 150. Accordingly, the lower electrode 120, the P-type thermoelectric leg 130, the N-type thermoelectric leg 140, and the upper electrode 150 may be sealed from external moisture, heat, and contamination. Here, the sealing member may include a sealing case, which is disposed to be spaced a predetermined distance from a side surface of the outermost electrode among the plurality of lower electrodes 120, from a side surface of the outermost electrode among the plurality of P-type thermoelectric legs 130, from a side surface of the outermost electrode among the plurality of N-type thermoelectric legs 140, and from a side surface of the outermost electrode among the plurality of upper electrodes 150, a sealing material disposed between the sealing case and the lower substrate 110, and a sealing material disposed between the sealing case and the upper substrate 160. As described above, the sealing case may be in contact with the lower substrate 110 and the upper substrate 160 through the sealing materials. Accordingly, when the sealing case is in direct contact with the lower substrate 110 and the upper substrate 160, thermal conduction may occur through the sealing case, and as a result, a problem in that a temperature difference between the lower substrate 110 and the upper substrate 160 is reduced may be prevented. Here, the sealing material may include at least one of an epoxy resin and a silicone resin or include tape of which both surfaces is coated with at least one of an epoxy resin and a silicone resin. The sealing material may serve to airtightly seal between the sealing case and the lower substrate 110 and between the sealing case and the upper substrate 160 and to increase the sealing effect of the lower electrode 120, the P-type thermoelectric leg 130, the N-type thermoelectric leg 140, and the upper electrode 150, and the sealing material may be mixed with a closing material, a closing layer, a waterproofing material, a waterproofing layer, or the like. However, the above description of the sealing member is merely exemplary, and the sealing member may be modified in various forms. Although not illustrated, an insulating material may be further included to surround the sealing member. Alternatively, the sealing member may include a heat insulating component.

Meanwhile, the P-type thermoelectric leg 130 and the N-type thermoelectric leg 140 may have a structure illustrated in FIG. 1A or 1B. Referring to FIG. 1A, the thermoelectric legs 130 and 140 may include thermoelectric material layers 132 and 142, first plating layers 134-1 and 144-1, which are laminated on one surfaces of the thermoelectric material layers 132 and 142, and second plating layers 134-2 and 144-2, which are laminated on the other surfaces of the thermoelectric material layers 132 and 142 disposed opposite to the one surfaces. Alternatively, referring to FIG. 1B, the thermoelectric legs 130 and 140 may include thermoelectric material layers 132 and 142, first plating layers 134-1 and 144-1, which are laminated on one surfaces of the thermoelectric material layers 132 and 142, second plating layers 134-2 and 144-2, which are laminated on the other surfaces of the thermoelectric material layers 132 and 142 disposed opposite to the one surfaces, and first buffer layers 136-1 and 146-1 and second buffer layers 136-2 and 146-2, which are disposed between the thermoelectric material layers 132 and 142 and the first plating layers 134-1 and 144-1 and between the thermoelectric material layers 132 and 142 and the second plating layers 134-2 and 144-2. Alternatively, the thermoelectric legs 130 and 140 may further include a metal layer disposed between each of the first plating layers 134-1 and 144-1 and the second plating layers 134-2 and 144-2 and each of the lower substrate 110 and the upper substrate 160.

Here, the thermoelectric material layers 132 and 142 may include bismuth (Bi) and tellurium (Te), which are semiconductor materials. The thermoelectric material layers 132 and 142 may have the same material or shape as the P-type thermoelectric leg 130 or the N-type thermoelectric leg 140 described above. When the thermoelectric material layers 132 and 142 are polycrystalline, a bonding force between the thermoelectric material layers 132 and 142, the first buffer layers 136-1 and 146-1, and the first plating layers 134-1 and 144-1 and a bonding force between the thermoelectric material layers 132 and 142, the second buffer layers 136-2 and 146-2, and the second plating layers 134-2 and 144-2 may be increased. Accordingly, even when the thermoelectric element 100 is applied to an application in which vibration occurs, for example, a vehicle, a problem in that the first plating layers 134-1 and 144-1 and the second plating layers 134-2 and 144-2 are separated from the P-type thermoelectric legs 130 or the N-type thermoelectric legs 140 and are carbonized may be prevented, and the durability and reliability of the thermoelectric element 100 may be increased.

In addition, the metal layer may be selected from among copper (Cu), a copper alloy, aluminum (Al), and an aluminum alloy and may have a thickness of 0.1 to 0.5 mm, and preferably, 0.2 to 0.3 mm.

Next, the first plating layers 134-1 and 144-1 and the second plating layers 134-2 and 144-2 may each include at least one of Ni, Sn, Ti, Fe, Sb, Cr, and Mo, and may have a thickness of 1 to 20 µm, and preferably, 1 to 10 µm. The first plating layers 134-1 and 144-1 and the second plating layers 134-2 and 144-2 may prevent reaction between Bi or Te, which is a semiconductor material, and the metal layer in the thermoelectric material layers 132 and 142, and thus the performance degradation of the thermoelectric element may be prevented and oxidation of the metal layer may also be prevented.

In this case, the first buffer layers 136-1 and 146-1 and the second buffer layers 136-2 and 146-2 may be disposed between the thermoelectric material layers 132 and 142 and the first plating layers 134-1 and 144-1 and between the thermoelectric material layers 132 and 142 and the second plating layers 134-2 and 144-2. In this case, the first buffer layers 136-1 and 146-1 and the second buffer layers 136-2 and 146-2 may include Te. For example, the first buffer layers 136-1 and 146-1 and the second buffer layers 136-2 and 146-2 may include at least one of Ni—Te, Sn—Te, Ti—Te, Fe—Te, Sb—Te, Cr—Te, and Mo—Te. According to the embodiment of the present invention, when the first buffer layers 136-1 and 146-1 and the second buffer layers 136-2 and 146-2 including Te are disposed between the thermoelectric material layers 132 and 142 and the first plating layers 134-1 and 144-1 and the second plating layers 134-2 and 144-2, it is possible to prevent Te in the thermoelectric material layers 132 and 142 from being diffused to the first plating layers 134-1 and 144-1 and the second plating layers 134-2 and 144-2. Accordingly, due to the Bi-rich region, it is possible to prevent an increase in electrical resistance in the thermoelectric material layer.

In the above, the terms "the lower substrate 110," "the lower electrode 120," "the upper electrode 150," and "the upper substrate 160" are used, but these terms are arbitrarily referred to as upper and lower substrates or electrodes for ease of understanding and for convenience of description. Conversely, positions thereof may be reversed, such as the lower substrate 110 and the lower electrode 120 being disposed on the upper side and the upper electrode 150 and the upper substrate 160 being disposed on the lower side. In this specification, the term "the lower substrate 110" may be used as the term "the first substrate 110," the term "the lower electrode 120" may be used as the term "the first electrode 120," the term "the upper electrode 150" may be used as the term "the second electrode 150," and the term "the upper substrate 160" may be used as the term "the second substrate 160."

Referring to FIG. 3, a heat sink 200 is disposed on the upper substrate, that is, the second substrate 160. In this case, the heat sink 200 may be implemented to form an air flow path using a plate-shaped base so as to be brought into surface contact with air passing through the heat sink 200. That is, the heat sink 200 may have a structure in which the base is folded such that repetitive patterns having a predetermined pitch P and height H are formed, that is, a folding structure.

Meanwhile, in order to bond the second substrate 160 to the heat sink 200, an adhesive layer 300 formed as a layer including at least one of a polymer resin and a metal may be disposed between the second substrate 160 and the heat sink 200. The second substrate 160 and the heat sink 200 may be bonded through a process in which pressure or heat is applied or pressure and heat are applied simultaneously.

Referring to FIGS. 4A and 4B, even after the bonding process, a plurality of air bubbles may remain in the adhesive layer 300 disposed between the second substrate 160 and the heat sink 200. The adhesive layer 300 may be in the form of a paste before being cured as a mixture of a polymer resin and a meal material. The polymer resin may impart fluidity to the adhesive layer 300 to facilitate application on the second substrate 160, and the meal material may include at least one of tin (Sn), silver (Ag), copper (Cu), and aluminum (Al) to impart a bonding force between the second substrate 160 and the heat sink 200 and heat transfer characteristics. A plurality of air bubbles are included in the polymer resin and a heat transfer path between the second substrate 160 and the heat sink 200 is reduced due to the air bubbles, and thus heat transfer performance may be lowered. In addition, due to the air bubbles, the bonding performance between the second substrate 160 and the heat sink 200 may be lowered.

An amount of air bubbles in the adhesive layer 300 disposed between the second substrate 160 and the heat sink 200 may be changed according to a bonding area between the second substrate 160 and the heat sink 200, the thickness of the second substrate 160 and the heat sink 200, or the material of the adhesive layer 300. As the bonding area between the second substrate 160 and the heat sink 200 or the thickness of the second substrate 160 and the heat sink 200 increases or as the content of the polymer resin in the adhesive layer 300 increases, it is difficult for the air bubbles generated in the adhesive layer 300 to leak out to the outside, and thus the plurality of air bubbles may remain even after the bonding process. When the bonding area between the second substrate 160 and the heat sink 200 is reduced by reducing a pitch of the heat sink 200, the amount of the air bubbles in the adhesive layer 300 may be reduced. However, in application fields in which high or low temperature air forcibly flows into the heat sink 200 region, the resistance of air may be increased and the air pressure in an adjacent region may be increased. Accordingly, some of the stagnant air that does not pass through the heat sink 200 region may flow backward and negatively affect the surrounding system, and the air passing through the heat sink 200 may also not have an appropriate amount of flow. Therefore, in order to prevent a decrease in the efficiency of the thermoelectric module or the efficiency of a thermoelectric system to which the thermoelectric module is applied, it is desirable to minimize a difference between air pressure before passing through the heat sink 200 and air pressure after passing through the heat sink 200.

Accordingly, in the embodiment of the present invention, it is intended to provide a structure of a heat sink or a substrate in which all heat transfer performance, bonding performance, and power generation performance are improved.

FIG. 5 illustrates cross-sectional views of a thermoelectric module according to an embodiment of the present invention, FIG. 6 illustrates perspective views of a heat sink included in the thermoelectric module according to the embodiment of FIG. 5, and FIG. 7 illustrates enlarged partial cross-sectional views of the thermoelectric module according to the embodiment of FIG. 5. Here, since a detailed structure of the thermoelectric element 100, that is, contents of a lower substrate 110, lower electrodes 120, P-type thermoelectric legs 130, N-type thermoelectric legs 140, upper electrodes 150, an upper substrate 160, and an insulating layer 170, may be applied in the same manner as the contents described in FIGS. 1 and 2, descriptions thereof will not be repeated for convenience of description.

Referring to FIGS. 5 to 7, an adhesive layer 300 is disposed on the second substrate 160, and a heat sink 200 is disposed on the adhesive layer 300. The second substrate 160 and the heat sink 200 may be bonded to each other by the adhesive layer 300. Here, an example of the heat sink 200 is described as being disposed on the upper substrate 160, that is, the second substrate 160, but this is for convenience of description, and the present invention is not limited thereto. That is, the heat sink 200 having the same structure as in the embodiment of the present invention may be disposed on the lower substrate 110, that is, the first substrate 110, or may be disposed on both the first substrate 110 and the second substrate 160.

According to the embodiment of the present invention, the heat sink 200 may have a shape in which predetermined patterns are regularly repeated and connected. That is, the heat sink 200 may include a first pattern X1, a second pattern X2, and a third pattern X3, and the patterns may be flat plates that are connected sequentially and formed as an integral form.

According to the embodiment of the present invention, each of the patterns X1, X2, and X3 may include a first surface 210, a second surface 220, a third surface 230, and a fourth surface 240 which are sequentially connected, and each of the first surface 210, the second surface 220, the third surface 230, and the fourth surface 240 may be provided with a plurality of surfaces.

The first surface 210 may face the second substrate 160 and be disposed to be in direct contact with the adhesive layer 300. The second surface 220 may extend upward from a first end of the first surface 210. The fourth surface 240 may extend upward from a second end facing the first end of the first surface 210. The third surface 230 may be a surface, which faces the second substrate 160, extends from the second surface 220 to be spaced apart from the adhesive layer 300, and extends from a fourth surface 240 of an adjacent pattern to be connected to each other. The first surface 210, the second surface 220, the third surface 230, and the fourth surface 240 may be sequentially folded to have a structure of an integral form. Further, the first surface 210 may be parallel to the second substrate 160, and the third surface 230 may be parallel to the second substrate 160. In the present embodiment, the meaning of the term "parallel" may be defined as an internal angle between an upper surface of the second substrate 160, that is, a surface of the second substrate 160 in direct contact with the adhesive layer 300, and the first surface 210 or the third surface 230 being within 2°.

Here, the term "upward" may refer to a direction away from the second substrate 160 on the second substrate 160, and the term "downward" may refer to a direction closer to the second substrate 160 on the second substrate 160. That is, a distance between the third surface 230 and the second substrate 160 may be greater than a distance between the first surface 210 and the second substrate 160.

The second surface 220 of the first pattern X1 may be connected to the fourth surface 240 of the second pattern X2 adjacent to the first pattern X1 through the third surface 230 of the first pattern X1, and similarly, the second surface 220 of the second pattern X2 may be connected to the fourth surface 240 of the third pattern X3 adjacent to the second pattern X2 through the third surface 230 of the second pattern X2.

Meanwhile, according to the embodiment of the present invention, as illustrated in FIG. 7A, a width W3 of the third surface 230 may be greater than a width W1 of the first surface 210. To this end, any one of a fifth surface 250, which is disposed between the first surface 210 and the second surface 220 to connect the first surface 210 to the second surface 220, and a sixth surface 260, which is disposed between the first surface 210 and the fourth surface 240 to connect the first surface 210 to the fourth surface 240, may be further included, or both the fifth surface 250 and the sixth surface 260 may be further included. An internal angle $\theta 1$ between the first surface 210 and the fifth surface 250 may be different from an internal angle $\theta 2$ between the second surface 220 and the third surface 230 at a boundary between the second surface 220 and the third surface 230. Further, an internal angle $\theta 3$ between the fifth surface 250 and the second surface 220 may be different from an internal angle $\theta 2$ between the second surface 220 and the third surface 230 at the boundary between the second surface 220 and the third surface 230. For example, the internal angle $\theta 1$ between the first surface 210 and the fifth surface 250 at a boundary between the first surface 210 and the fifth surface 250 may be greater than the internal angle $\theta 2$ between the second surface 220 and the third surface 230 at the boundary between the second surface 220 and the third surface 230. In addition, the internal angle $\theta 3$ between the fifth surface 250 and the second surface 220 at a boundary between the fifth surface 250 and the second surface 220 may be greater than the internal angle $\theta 2$ between the second surface 220 and the third surface 230 at the boundary between the second surface 220 and the third surface 230. When the sixth surface 260 which is disposed between the first surface 210 and the fourth surface 240 to connect the first surface 210 to the fourth surface 240 is further included, the sixth surface 260 may be formed to have a shape substantially symmetrical to the fifth surface 250. Therefore, an internal angle $\theta 4$ between the sixth surface 260 and the first surface 210 or an internal angle θ5 between the sixth surface 260 and the fourth surface 240 may be configured in the same manner as in a relationship between the internal angles θ1 and θ3 described above. In FIGS. 7A and 7B, an example in which the fifth surface 250 is disposed between the first surface 210 and the second surface 220 and the sixth surface 260 symmetrical to the fifth surface 250 is disposed between the first surface 210 and the fourth surface 240 is mainly illustrated, but the present invention is not limited thereto. As illustrated in FIGS. 5A and 5B, the fifth surface 250 may be disposed between the first surface 210 and the second surface 220 and the first surface 210 and the fourth surface 240 may be directly connected to each other, and, although not illustrated, the sixth surface 260 may be disposed between the first surface 210 and the fourth surface 240 and the first surface 210 and the second surface 220 may be directly connected to each other.

Referring to FIGS. 7A and 7B, it can be seen that the internal angle θ1 between the first surface 210 and the fifth surface 250 at the boundary between the first surface 210 and the second surface 220 is greater than 90° and has an obtuse angle and the internal angle θ2 between the second surface 220 and the third surface 230 at the boundary between the second surface 220 and the third surface 230 is almost a right angle. Accordingly, since a contact area between the first surface 210 and the adhesive layer 300 may be reduced, air bubbles in the adhesive layer 300 may be reduced. Further, since the contact area between the first surface 210 and the adhesive layer 300 may be reduced while maintaining a pitch P for each pattern of the patterns forming the heat sink 200, it is possible to minimize a difference between air pressure before passing through the heat sink 200 region and air pressure after passing through the heat sink 200 region.

More specifically, as illustrated in FIGS. 7A and 7B, a distance d1 between the second surface 220 of the first pattern X1 and the fourth surface 240 of the second pattern X2 may be smaller than a distance d2 between the fifth surface 250 of the first pattern X1 and the sixth surface 260 of the second pattern X2, and a distance d3 between the fourth surface 240 of the second pattern X2 and the second surface 220 of the second pattern X2 may be smaller than a distance d4 between the fifth surface 250 of the second pattern X2 and the sixth surface 260 of the second pattern X2. Accordingly, the contact area between the first surface 210 and the adhesive layer 300 may be reduced while maintaining the pitch P for each pattern of the patterns forming the heat sink 200, and an area of the flow path through which air passes is not substantially reduced, and thus a difference between air pressure before passing through the heat sink 200 region and air pressure after passing through the heat sink 200 region may be minimized. In this case, the width W1 of the first surface 210 for each pattern may be 0.2 to 0.4 times a pitch of the pattern, for example, the distance from the fourth surface 240 of the first pattern X1 to the fourth surface 240 of the second pattern X2, and a maximum height from the first surface 210 of the fifth surface 250 or the sixth surface 260 may be 1.5 to 3 times a thickness of the adhesive layer 300 disposed below the first surface 210. For example, when the pitch of the pattern is 3.76 mm, the width W1 of the first surface 210 may range from 0.75 to 1.5 mm, preferably, 0.85 to 1.35 mm, and more preferably, 0.95 to 1.2 mm, and when the thickness of the adhesive layer 300 is 1.5 mm, the maximum height from the first surface 210 of the fifth surface 250 or the sixth surface 260 may range from 3 to 4.5 mm. Accordingly, the area of the first surface 210 bonded to the adhesive layer 300 may be minimized without reducing the pitch of the pattern, and thus it is possible to minimize a difference between the air pressure before passing through the heat sink 200 region and the air pressure after passing through the heat sink 200 region.

Meanwhile, as illustrated in FIG. 7A, the adhesive layer 300 may be disposed below the first surface 210 to be in direct contact with the first surface 210, but as illustrated in FIG. 7B, a portion of the adhesive layer 300 may also be in direct contact with at least a portion of the fifth surface 250 and the sixth surface 260. Accordingly, a maximum height h2 of the adhesive layer 300 in direct contact with at least a portion of the fifth surface 250 and the sixth surface 260 may be greater than a maximum height h1 of the adhesive layer 300 in direct contact with the first surface 210. In a process in which the adhesive layer 300 is applied onto the second substrate 160 and the first surface 210 is disposed on the adhesive layer 300 and then pressed, the adhesive layer 300 may be formed by a process in which air bubbles leak out toward the fifth surface 250 and the sixth surface 260 and then the adhesive layer 300 is cured. Accordingly, since the adhesive layer 300 is disposed not only on the first surface 210 but also on the fifth surface 250 and the sixth surface 260, a bonding force between the second substrate 160 and the heat sink 200 may be increased. In addition, due to the maximum height h2 of the adhesive layer 300, the air bubbles may more easily leak out from the adhesive layer 300.

In this case, the adhesive layer 300 may be applied to an entire surface of the second substrate 160 but, preferably, may be applied only to a region on which the first surface 210 is disposed. Accordingly, the adhesive layer 300 may not be disposed on at least a portion of the second substrate 160 corresponding to the third surface 230. For example, the adhesive layer 300 may not be disposed on at least a portion of the second substrate 160 corresponding to a middle point of the width of the third surface 230. Accordingly, an amount of material forming the adhesive layer 300 may be minimized and a space between the second substrate 160 and the third surface 230 may be widened, and thus the air may flow efficiently.

FIG. 8 is a graph showing a difference in air pressure with respect to an area of the air flow path of the heat sink.

Referring to FIG. 8, it can be seen that a ratio with respect to a difference in air pressure increases as a ratio with respect to an area of air decreases based on the case where an area of air is 1. Here, the difference in air pressure may refer to a difference between air pressure before passing through the heat sink and air pressure after passing through the heat sink. That is, it can be seen that the area of the air flow path of the heat sink becomes smaller as the pitch of the heat sink 200 decreases and that the difference between the air pressure before passing through the heat sink 200 region and the air pressure after passing through the heat sink 200 region increases. This means that air resistance and air pressure in the surrounding region increase as the area of the air flow path of the heat sink decreases and thus the air flow through the heat sink is restricted.

For example, an actual area of air in the case in which a pitch of any one of two heat sinks which are disposed in the same region and have the same area and height of the heat sink and the same thickness of the plate is reduced by half is reduced by about 0.9 times compared to a pitch of the other sink. Accordingly, a ratio of the difference in air pressure is about 1.1, which may be an increase of about 10% or more.

Meanwhile, when the heat sink is designed as in the embodiment of the present invention, the area of the air may not be substantially reduced while minimizing the contact area with the adhesive layer 300. Therefore, it can be seen that the thermoelectric module, in which bonding performance between the substrate and the heat sink is improved and thermoelectric performance is not lowered, may be obtained.

FIG. 9 is a partial cross-sectional view of a thermoelectric module according to another embodiment of the present invention, FIG. 10 is a top view of a heat sink included in the thermoelectric module according to the embodiment of FIG. 9, FIG. 11 is a perspective view of the heat sink included in the thermoelectric module according to the embodiment of FIG. 9, and FIG. 12 illustrates specific examples of a portion of the heat sink included in the thermoelectric module according to the embodiment of FIG. 9. Here, since a detailed structure of the thermoelectric element 100, that is, contents of a lower substrate 110, lower electrodes 120, P-type thermoelectric legs 130, N-type thermoelectric legs 140, upper electrodes 150, and an insulating layer 170, are not illustrated separately and the contents described in FIGS. 1 and 2 may be applied in the same manner, descriptions thereof will not be repeated for convenience of description.

Referring to FIGS. 9 to 12, an adhesive layer 300 is disposed on a second substrate 160, and a heat sink 200 is disposed on the adhesive layer 300. The second substrate 160 and the heat sink 200 may be bonded to each other by the adhesive layer 300. Here, an example of the heat sink 200 is described as being disposed on an upper substrate 160, that is, the second substrate 160, but this is for convenience of description, and the present invention is not limited thereto. That is, the heat sink 200 having the same structure as in the embodiment of the present invention may be disposed on the lower substrate 110, that is, the first substrate 110, or disposed on both the first substrate 110 and the second substrate 160.

According to the embodiment of the present invention, the heat sink 200 may have a shape in which predetermined patterns are regularly repeated and connected. That is, the heat sink 200 may include a first pattern X1, a second pattern X2, and a third pattern X3, and the patterns may be flat plates that are connected sequentially and formed as an integral form.

According to the embodiment of the present invention, each of the patterns X1, X2, and X3 may include a first surface 210, a second surface 220, a third surface 230, and a fourth surface 240 which are sequentially connected, and each of the first surface 210, the second surface 220, the third surface 230, and the fourth surface 240 may be provided with a plurality of surfaces.

The first surface 210 may face the second substrate 160 and may be disposed to be in direct contact with the adhesive layer 300. The second surface 220 may extend upward from a first end of the first surface 210. The fourth surface 240 may extend upward from a second end of the first surface 210 facing the first end. The third surface 230 may face the second substrate 160, extend from the second surface 220 to be spaced apart from the adhesive layer 300, and extend from a fourth surface 240 of a pattern adjacent thereto to be connected to each other. The first surface 210, the second surface 220, the third surface 230, and the fourth surface 240 may be sequentially folded to have a structure of an integral form. Further, the first surface 210 may be parallel to the second substrate 160 and the third surface 230 may be parallel to the second substrate 160. In the present embodiment, the meaning of the term "parallel" may be defined as an internal angle between an upper surface of the second substrate 160, that is, a surface of the second substrate 160 in direct contact with the adhesive layer 300, and the first surface 210 or the third surface 230 being within 2°.

Here, the term "upward" may refer to a direction away from the second substrate 160 on the second substrate 160, and the term "downward" may refer to a direction closer to the second substrate 160 on the second substrate 160. That is, a distance between the third surface 230 and the second substrate 160 may be greater than a distance between the first surface 210 and the second substrate 160.

The second surface 220 of the first pattern X1 may be connected to the fourth surface 240 of the second pattern X2 adjacent to the first pattern X1 through the third surface 230 of the first pattern X1, and similarly, the second surface 220 of the second pattern X2 may be connected to the fourth surface 240 of the third pattern X3 adjacent to the second pattern X2 through the third surface 230 of the second pattern X2. In this case, the adhesive layer 300 may be applied to an entire surface of the second substrate 160 but, preferably, may be applied only to a region on which the first surface 210 is disposed. Accordingly, the adhesive layer 300 may not be disposed on at least a portion of the second substrate 160 corresponding to the third surface 230. For example, the adhesive layer 300 may not be disposed on at least a portion of the second substrate 160 corresponding to a middle point of the width of the third surface 230. Accordingly, an amount of material forming the adhesive layer 300 may be minimized and a space between the second substrate 160 and the third surface 230 is widened, and thus the air may flow efficiently.

Meanwhile, according to the embodiment of the present invention, a plurality of holes 212 formed at predetermined or irregular intervals may be disposed in the first surface 210. Accordingly, the adhesive layer 300 may protrude through at least some of the plurality of holes 212 and be disposed on the first surface 210. In a process in which the adhesive layer 300 is applied onto the second substrate 160 and the first surface 210 is disposed on the adhesive layer 300 and then pressed, the adhesive layer 300 may be formed by a process in which air bubbles leak out through the holes 212 of the first surface 210 and then the adhesive layer 300 is cured. Accordingly, since the adhesive layer 300 is disposed not only on a lower surface of the first surface 210 but also on an upper surface of the first surface 210, a bonding force between the second substrate 160 and the heat sink 200 may be increased. In addition, due to the adhesive layer 300 protruding from the first surface 210, the air bubbles may more easily leak out from the adhesive layer 300. Here, the holes 212 may be processed using an etching method or a drilling method, but the present invention is not limited thereto.

In this case, an area of the plurality of holes 212 formed in the first surface 210 may range from 10 to 30% of an area of the first surface 210. When the area of the plurality of holes 212 is less than 10% of the area of the first surface 210, it may be difficult for the air bubbles in the adhesive layer 300 to leak out, and when the area of the plurality of holes 212 is greater than 30% of the area of the first surface 210, the bonding force between the first surface 210 and the second substrate 160 may be lowered.

Alternatively, a diameter of at least one of the plurality of holes 212 may range from 25 to 75% of a width W1 of the first surface 210, that is, of a distance between the fourth surface 240 of the first pattern X1 and the second surface 220 of the first pattern X1. When the diameter of the hole 212 is less than 25% of the distance between the fourth surface 240 of the first pattern X1 and the second surface 220 of the first pattern X1, it may be difficult for the air bubbles in the adhesive layer 300 to leak out, and when the diameter of the hole 212 is greater than 75% of the distance between the fourth surface 240 of the first pattern X1 and the second surface 220 of the first pattern X1, the bonding force between the first surface 210 and the second substrate 160 may be lowered or the resistance of air may be increased.

Meanwhile, referring to FIG. 12, a shape of the hole may be variously modified. For example, referring to FIG. 12A, a diameter of the hole 212 at a lowest point 210-L of the first surface 210 may be identical to a diameter of the hole 212 at a highest point 210-H. Alternatively, referring to FIG. 12B, the diameter of the hole 212 at the lowest point 210-L of the first surface 210 may be different from the diameter of the hole 212 at the highest point 210-H. For example, the diameter of the hole 212 at the highest point 210-H of the first surface 210 may be greater than the diameter of the hole 212 at the lowest point 210-L. In this case, the diameter of the hole 212 at the highest point 210-H may range from 75 to 100% of the width W1 of the first surface 210, that is, of the distance between the fourth surface 240 of the first pattern X1 and the second surface 220 of the second pattern X2. As described above, when the diameter of the hole 212 at the highest point 210-H of the first surface 210 is greater than the diameter of the hole 212 at the lowest point 210-L, a path, through which the air in the adhesive layer 300 may leak out, may be expanded without reducing the bonding force between the second substrate 160 and the heat sink 200.

FIG. 13 is a partial cross-sectional view of a thermoelectric module according to still another embodiment of the present invention, FIG. 14 is a top view of a heat sink included in the thermoelectric module according to the embodiment of FIG. 13, and FIG. 15 is a perspective view of the heat sink included in the thermoelectric module according to the embodiment of FIG. 13. Here, since a detailed structure of the thermoelectric element 100, that is, contents of a lower substrate 110, lower electrodes 120, P-type thermoelectric legs 130, N-type thermoelectric legs 140, upper electrodes 150, and an insulating layer 170, are not illustrated separately and the contents described in FIGS. 1 and 2 may be applied in the same manner, descriptions thereof will not be repeated for convenience of description. In addition, the same contents among the contents described in FIGS. 9 to 12 will not be repeated.

Referring to FIGS. 13 to 15, at least one slit 214 may be further formed along a boundary between the first surface 210 and the second surface 220 and a boundary between the first surface 210 and the fourth surface 240. Accordingly, an adhesive layer 300 may protrude through the slit 214 and be disposed on the first surface 210 and the second surface 220 and may be further disposed on the first surface 210 and the fourth surface 240. In a process in which the adhesive layer 300 is applied onto the second substrate 160 and the first surface 210 is disposed on the adhesive layer 300 and then pressed, the adhesive layer 300 may be formed by a process in which air bubbles leak out through the slit 214 and then the adhesive layer 300 is cured. Accordingly, since the adhesive layer 300 is disposed not only on a lower surface of the first surface 210 but also on an upper surface of the first surface 210 and the second surface 220, a bonding force between the second substrate 160 and the heat sink 200 may be increased. In addition, due to the adhesive layer 300 protruding from the first surface 210 and the second surface 220, the air bubbles may more easily leak out from the adhesive layer 300.

FIGS. 16 to 18 are partial cross-sectional views of a thermoelectric module according to yet another embodiment of the present invention. Here, since a detailed structure of the thermoelectric element 100, that is, contents of a lower substrate 110, lower electrodes 120, P-type thermoelectric legs 130, N-type thermoelectric legs 140, upper electrodes 150, and an insulating layer 170, are not illustrated separately and the contents described in FIGS. 1 and 2 may be applied in the same manner, descriptions thereof will not be repeated for convenience of description.

Referring to FIGS. 16 to 18, an adhesive layer 300 is disposed on the second substrate 160 and a heat sink 200 is disposed on the adhesive layer 300. The second substrate 160 and the heat sink 200 may be bonded to each other by the adhesive layer 300. Here, an example of the heat sink 200 is described as being disposed on the upper substrate 160, that is, the second substrate 160, but this is for convenience of description, and the present invention is not limited thereto. That is, the heat sink 200 having the same structure as in the embodiment of the present invention may be disposed on the lower substrate 110, that is, the first substrate 110, or disposed on both the first substrate 110 and the second substrate 160.

According to the embodiment of the present invention, the heat sink 200 may have a shape in which predetermined patterns are regularly repeated and connected. That is, the heat sink 200 may include a first pattern X1 and a second pattern X2, and the patterns may be flat plates that are connected sequentially and formed as an integral form.

According to the embodiment of the present invention, each of the patterns X1 and X2 may include a first surface 210, a second surface 220, a third surface 230, and a fourth surface 240 which are sequentially connected, and each of the first surface 210, the second surface 220, the third surface 230, and the fourth surface 240 may be provided with a plurality of surfaces.

The first surface 210 may face the second substrate 160 and be disposed to be in direct contact with the adhesive layer 300. The second surface 220 may extend upward from a first end of the first surface 210. The fourth surface 240 may extend upward from a second end of the first surface 210 facing the first end. The third surface 230 may face the second substrate 160, extend from the second surface 220 to be spaced apart from the adhesive layer 300, and extend from a fourth surface 240 of a pattern adjacent thereto to be connected to each other. The first surface 210, the second surface 220, the third surface 230, and the fourth surface 240 may be sequentially folded to have a structure of an integral form. Further, the first surface 210 may be parallel to the second substrate 160 and the third surface 230 may be parallel to the second substrate 160. In the present embodiment, the meaning of the term "parallel" may be defined as an internal angle between the upper surface of the second substrate 160, that is, a surface of the second substrate 160 in direct contact with the adhesive layer 300, and the first surface 210 or the third surface 230 being within 2°.

Here, the term "upward" may refer to a direction away from the second substrate 160 on the second substrate 160, and the term "downward" may refer to a direction closer to the second substrate 160 on the second substrate 160. That is, a distance between the third surface 230 and the second substrate 160 may be greater than a distance between the first surface 210 and the second substrate 160.

The second surface 220 of the first pattern X1 may be connected to the fourth surface 240 of the second pattern X2 adjacent to the first pattern X1 through the third surface 230 of the first pattern X1, and similarly, the second surface 220 of the second pattern X2 may be connected to the fourth surface 240 of a third pattern X3 adjacent to the second pattern X2 through the third surface 230 of the second pattern X2.

In this case, the adhesive layer 300 may be applied to an entire surface of the second substrate 160 but, preferably, may not be disposed on at least a portion of the second substrate 160 corresponding to the third surface 230. For example, the adhesive layer 300 may not be disposed on at least a portion of the second substrate 160 corresponding to a middle point of the width of the third surface 230. Accordingly, an amount of material forming the adhesive layer 300 may be minimized and a space between the second substrate 160 and the third surface 230 is widened, and thus the air may flow efficiently.

Meanwhile, according to the embodiment of the present invention, regularly repeated predetermined grooves 162 may be formed in the second substrate 160, and the adhesive layer 300 and the first surface 210 may be disposed in the groove 162.

In this case, each groove 162 may include a bottom surface 162-1 and two wall surfaces 162-2 and 162-3 which extend upward from both sides of the bottom surface 162-1, and the adhesive layer 300 and the first surface 210 may be sequentially laminated on the bottom surface 162-1.

In this case, a portion of the second surface 220 and a portion of the fourth surface 240, which are connected to the first surface 210, may be further disposed in the groove 162, and the adhesive layer 300 may be further disposed between the wall surfaces 162-2 and 162-3 of the groove 162, the portion of the second surface 220, and the portion of the fourth surface 240.

Accordingly, a bonding area between the second substrate 160 and the heat sink 200 is substantially increased due to the groove 162, and thus a bonding force between the second substrate 160 and the heat sink 200 may be increased. In addition, due to the adhesive layer 300 disposed between the wall surfaces 162-2 and 162-3 of the groove 162, the portion of the second surface 220, and the portion of the fourth surface 240, a path through which air bubbles in the adhesive layer 300 may leak out may be expanded.

The sum of separation distances between the wall surfaces 162-2 and 162-3 of each groove 162 and each pattern accommodated in each groove 162 may range from 0.2 to 1.0 mm. Accordingly, the first surface 210 of each pattern of the heat sink 200 may be accommodated in the groove 162 of the second substrate 160. For example, when the sum of the separation distances between the wall surfaces 162-2 and 162-3 of each groove 162 and each pattern accommodated in each groove 162 is less than 0.2 mm, some of the patterns of the heat sink 200 are expanded and separated from the groove 162 due to heat applied during the process of bonding between the second substrate 160 and the heat sink 200, or modification of the shape of the groove 162 or a decrease in bonding force may be caused, and as a result, the characteristics of the heat sink 200 may be lowered. Further, when the sum of the separation distances between the wall surfaces 162-2 and 162-3 of each groove 162 and each pattern accommodated in each groove 162 is greater than 1.0 mm, an amount of solders to be applied becomes too large, and accordingly, a possibility of air bubbles being generated in the adhesive layer is increased.

In this case, one wall surface 162-3 of the groove 162 may be connected to one wall surface 162-2 of another groove 162 adjacent to the groove 162 through a connection surface 162-4. In this case, the connection surface 162-4 may be disposed below the third surface 230 of the heat sink 200 to be parallel to the third surface 230. Here, a distance T1 between the connection surface 162-4 and the third surface 230 may be 0.8 times or more and less than 1 times a vertical distance between the first surface 210 and the third surface 230. When the distance T1 between the connection surface 162-4 and the third surface 230 is less than 0.8 times the vertical distance between the first surface 210 and the third surface 230, a depth of the groove becomes too large such that the amount of solders filling the groove is increased, and accordingly, possibility of air bubbles being generated in the adhesive layer is increased. Further, as the distance T1 between the connection surface 162-4 and the third surface 230 decreases, an area in which the air flows is not sufficiently provided. Therefore, a difference between air pressure before passing through the heat sink 200 region and air pressure after passing through the heat sink 200 region is likely to be increased.

Meanwhile, referring to FIG. 17, the adhesive layer 300 may be further disposed on at least a portion of a boundary between the wall surfaces 162-2 and 162-3 of each groove 162 and the connection surface 162-4. In a process in which the adhesive layer 300 is applied into the groove 162 of the second substrate 160 and the first surface 210 of the heat sink 200 is disposed on the adhesive layer 300 and then pressed, the adhesive layer 300 may be formed by a process in which air bubbles flow over the connection surface 162-4 along the wall surfaces 162-2 and 162-3 of the groove 162 and then the adhesive layer 300 is cured. Accordingly, since the adhesive layer 300 is disposed not only on a lower surface of the first surface 210 but also on the connection surface 162-4 of the groove 162 together with the second surface 220 and the third surface 230, the bonding area between the second substrate 160 and the heat sink 200 may be increased. In addition, due to the adhesive layer 300 protruding from the connection surface 162-4, the air bubbles may more easily leak out from the adhesive layer 300.

Meanwhile, referring to FIG. 18, a notch may be further formed in the groove 162. Here, the notch may refer to a small groove and be formed in various shapes, such as a V shape, a U shape, and the like. For example, at least one notch 164 may be further formed along a boundary between the bottom surface 162-1 and wall surfaces 162-2 and 162-3 of the groove 162 or at least one notch 164 may be further formed on at least one of the wall surfaces 162-2 and 162-3 of the groove 162 in a direction perpendicular to the bottom surface 162-1, and the adhesive layer 300 may be further disposed in the formed notch 164.

Accordingly, the bonding area between the second substrate 160 and the heat sink 200 is increased so that the bonding force between the second substrate 160 and the heat sink 200 may be increased, and a path through which air bubbles in the adhesive layer 300 may leak out through the notch may be expanded.

Meanwhile, the embodiments described above may be combined with each other.

FIGS. 19 to 22 are partial cross-sectional views of a thermoelectric module according to yet another embodiment of the present invention.

Referring to FIG. 19, the embodiment of FIG. 5 and the embodiment of FIG. 9 may be combined with each other. That is, the first surface 210 of the heat sink 200 may be formed to have a width smaller than that of the third surface 230, and the holes 212 may be formed in the first surface 210.

Alternatively, referring to FIG. 20, the embodiment of FIG. 5 and the embodiment of FIG. 16 may be combined with each other. That is, the first surface 210 of the heat sink 200 may be formed to have a width smaller than that of the third surface 230, and the grooves 162 may be formed in the second substrate 160 so that the first surface 210 may be disposed in the grooves 162.

Alternatively, referring to FIG. 21, the embodiment of FIG. 5, the embodiment of FIG. 9, and the embodiment of FIG. 16 may be combined with each other. That is, the first surface 210 of the heat sink 200 may be formed to have a width smaller than that of the third surface 230, the holes 212 may be formed in the first surface 210, and the grooves 162 may be formed in the second substrate 160 so that the first surface 210 may be disposed in the grooves 162.

Alternatively, referring to FIG. 22, the embodiment of FIG. 9 and the embodiment of FIG. 16 may be combined with each other. That is, the holes 212 may be formed in the first surface 210, and the grooves 162 may be formed in the second substrate 160 so that the first surface 210 may be disposed in the grooves 162.

In addition, the embodiments according to the present invention may be combined with each other in various ways.

The thermoelectric modules according to the embodiments of the present invention described above may be applied to heat conversion devices.

FIG. 23 is a perspective view illustrating an example of a heat conversion device to which the thermoelectric modules according to the embodiments of the present invention are applied, and FIG. 24 is an exploded perspective view of the heat conversion device of FIG. 23.

Referring to FIGS. 23 and 24, a heat conversion device 1000 includes a duct 1100, a first thermoelectric module 1200, a second thermoelectric module 1300, and a gas guide member 1400. Here, the heat conversion device 1000 may generate power by using a temperature difference between a cooling fluid flowing through an inside of the duct 1100 and high-temperature gas passing through an outside of the duct 1100.

To this end, the first thermoelectric module 1200 may be disposed on one surface of the duct 1100, and the second thermoelectric module 1300 may be disposed on the other surface of the duct 1100. In this case, among the both surfaces of each of the first thermoelectric module 1200 and the second thermoelectric module 1300, the surface disposed toward the duct 1100 may become a low-temperature unit, and the power may be generated using a temperature difference between the low-temperature unit and a high-temperature unit.

The cooling fluid introduced into the duct 1100 may be water, but the present invention is not limited thereto, and the cooling fluid may be any of various types of fluids having cooling performance. A temperature of the cooling fluid introduced into the duct 1100 may be less than 100° C., preferably, less than 50° C., and more preferably, less than 40° C., but the present invention is not limited thereto. A temperature of the cooling fluid discharged after passing through the duct 1100 may be greater than the temperature of the cooling fluid introduced into the duct 1100.

The cooling fluid is introduced from a cooling fluid inlet of the duct 1100 and discharged through a cooling fluid outlet.

Although not illustrated, heat radiation pins may be disposed on an inner wall of the duct 1100. A shape of the heat radiation pins, the number of heat radiation pins, and an area of the heat radiation pin occupying the inner wall of the duct 1100 may be variously changed according to the temperature of the cooling fluid, the temperature of waste heat, the required power generation capacity, or the like.

Meanwhile, the first thermoelectric module 1200 is disposed on one surface of the duct 1100, and the second thermoelectric module 1300 is disposed on the other surface of the duct 1100 to be symmetrical to the first thermoelectric module 1200.

Here, the first thermoelectric module 1200 and the second thermoelectric module 1300 disposed to be symmetrical to the first thermoelectric module 1200 may be referred to as a pair of thermoelectric modules or a unit thermoelectric module.

The gas guide member 1400, a sealing member 1800, and an insulating member 1700 may be disposed further, in a direction in which air flows, on the duct 1100.

However, examples to which the thermoelectric modules according to the embodiments of the present invention are applied are not limited thereto.

The thermoelectric modules according to the embodiments of the present invention may be applied to power generation devices, cooling devices, heating devices, or the like. Specifically, the thermoelectric modules according to the embodiments of the present invention may be mainly applied to optical communication modules, sensors, medical devices, measuring devices, aerospace industry, refrigerators, chillers, ventilation sheets for a vehicle, cup holders, washing machines, dryers, wine cellars, water purifiers, power supplies for a sensor, thermopiles, or the like.

In addition, the thermoelectric modules according to the embodiments of the present invention may be applied to other industrial fields for power generation, cooling, and heating.

According to the embodiments of the present invention, thermoelectric modules having excellent performance and high reliability can be obtained. In particular, according to the embodiments of the present invention, thermoelectric modules having improved heat transfer performance between a substrate and a heat sink, improved bonding performance, and high durability can be obtained.

The thermoelectric elements according to the embodiments of the present invention can be applied not only to applications implemented in a small size but also to applications implemented in large sizes such as vehicles, ships, steel mills, incinerators, and the like.

While the example embodiments of the present invention and their advantages have been described above in detail, it should be understood by those skilled in the art that various changes, substitutions and alterations may be made herein without departing from the scope of the invention as defined by the following claims.

The invention claimed is:

1. A thermoelectric module comprising:
    a thermoelectric element including a first substrate, a first electrode disposed on the first substrate, a semiconductor structure disposed on the first electrode, a second electrode disposed on the semiconductor structure, and a second substrate disposed on the second electrode;
    a heat sink disposed on the second substrate; and
    an adhesive layer configured to bond the second substrate to the heat sink,
    wherein the heat sink has a shape in which predetermined patterns are regularly repeated and connected,
    wherein each pattern includes a first surface disposed to face the second substrate, a second surface which extends upward from one end of the first surface, a third surface which extends from the second surface to face the second substrate, and a fourth surface which extends upward from the other end opposite to the one end of the first surface and is connected to a third surface of an adjacent pattern,
wherein a distance between the third surface and the second substrate is greater than a distance between the first surface and the second substrate,
wherein a plurality of regularly repeated grooves are formed in the second substrate,
wherein each groove includes a bottom surface, a first wall surface which extends upward from a first side of the bottom surface, and a second wall surface which extends upward from a second side of the bottom surface,
wherein the adhesive layer and the first surface are sequentially laminated on the bottom surface in each groove,
wherein a portion of the second surface and a portion of the fourth surface is disposed in each groove, and
wherein in each groove, the adhesive layer is disposed between the first wall surface and the portion of the second surface, and the adhesive layer is disposed between the second wall surface and the portion of the fourth surface.

2. The thermoelectric module of claim 1, wherein:
the plurality of grooves include a first groove and a second groove disposed to be adjacent to each other;
one wall surface of the first groove and one wall surface of the second groove are connected to each other through a connection surface disposed to face the third surface; and
the adhesive layer is further disposed on at least a portion of a boundary between the wall surface of each groove and the connection surface.

3. The thermoelectric module of claim 2, wherein the adhesive layer is undisposed on at least a portion of the connection surface corresponding to a middle point of a width of the third surface.

4. The thermoelectric module of claim 1, wherein a plurality of holes are formed in the first surface.

5. The thermoelectric module of claim 4, wherein the adhesive layer protrudes upward of the first surface through at least some of the plurality of holes.

6. The thermoelectric module of claim 4, wherein:
at least one slit is formed along at least one of a boundary between the first surface and the second surface and a boundary between the first surface and the fourth surface; and
the adhesive layer protrudes upward of the first surface through the at least one slit.

7. The thermoelectric module of claim 1, wherein the third surface has a width greater than a width of the first surface.

8. The thermoelectric module of claim 7, wherein:
each pattern further includes a fifth surface disposed between the first surface and the second surface to connect the first surface to the second surface; and
an internal angle between the first surface and the fifth surface is greater than an internal angle between the second surface and the third surface.

9. The thermoelectric module of claim 8, wherein:
surface; and
the adhesive layer is in direct contact with at least a portion of the fifth a thickness of the adhesive layer in direct contact with the fifth surface is greater than a thickness of the adhesive layer in direct contact with the first surface.

10. The thermoelectric module of claim 1, wherein the adhesive layer includes a polymer resin and a metal material.

11. The thermoelectric module of claim 10, wherein the metal material includes at least one of Sn, Ag, Cu and Al.

12. The thermoelectric module of claim 10, wherein the first surface is in direct contact with the adhesive layer.

13. The thermoelectric module of claim 7, wherein a plurality of holes are formed in the first surface.

14. The thermoelectric module of claim 7, wherein:
a plurality of holes are formed in the first surface;
a plurality of regularly repeated grooves are formed in the second substrate; and
the adhesive layer and the first surface are disposed in each groove.

15. The thermoelectric module of claim 1, wherein a plurality of holes are formed in the first surface.

16. The thermoelectric module of claim 1, wherein:
at least one notch is formed in each groove, and
the adhesive layer is further disposed in the at least one notch.

17. The thermoelectric module of claim 4, wherein a diameter of the at least one of the plurality of holes at the lowest point of the first surface is different from a diameter of the hole at the highest point of the first surface.

18. A power generation apparatus comprising:
a duct; and
a thermoelectric module disposed on the duct,
the thermoelectric module includes:
a thermoelectric element including a first substrate, a first electrode disposed on the first substrate, a semiconductor structure disposed on the first electrode, a second electrode disposed on the semiconductor structure, and a second substrate disposed on the second electrode;
a heat sink disposed on the second substrate; and
an adhesive layer configured to bond the second substrate to the heat sink,
wherein the heat sink has a shape in which predetermined patterns are regularly repeated and connected,
wherein each pattern includes a first surface disposed to face the second substrate, a second surface which extends upward from one end of the first surface, a third surface which extends from the second surface to face the second substrate, and a fourth surface which extends upward from the other end opposite to the one end of the first surface and is connected to a third surface of an adjacent pattern,
wherein a distance between the third surface and the second substrate is greater than a distance between the first surface and the second substrate,
wherein a plurality of regularly repeated grooves are formed in the second substrate,
wherein each groove includes a bottom surface, a first wall surface which extends upward from a first side of the bottom surface, and a second wall surface which extends upward from a second side of the bottom surface,
wherein the adhesive layer and the first surface are sequentially laminated on the bottom surface in each groove,
wherein a portion of the second surface and a portion of the fourth surface is disposed in each groove, and
wherein in each groove, the adhesive layer is disposed between the first wall surface and the portion of the second surface, and the adhesive layer is disposed between the second wall surface and the portion of the fourth surface.

\* \* \* \* \*